US008288951B2

(12) United States Patent
Storch et al.

(10) Patent No.: US 8,288,951 B2
(45) Date of Patent: Oct. 16, 2012

(54) ORGANIC LIGHT EMITTING DIODE LIGHTING SYSTEMS

(75) Inventors: Mark L. Storch, Pittsburgh, PA (US);
Mathew K. Mathai, Gibsonia, PA (US);
Glenn Thompson, Butler, PA (US);
Joseph Greenberg, Pittsburgh, PA (US)

(73) Assignee: Plextronics, Inc., Pittsburgh, PA (US)

( * ) Notice: Subject to any disclaimer, the term of this patent is extended or adjusted under 35 U.S.C. 154(b) by 558 days.

(21) Appl. No.: 12/543,440

(22) Filed: Aug. 18, 2009

(65) Prior Publication Data
US 2010/0045189 A1 Feb. 25, 2010

Related U.S. Application Data

(60) Provisional application No. 61/090,150, filed on Aug. 19, 2008, provisional application No. 61/102,326, filed on Oct. 2, 2008.

(51) Int. Cl.
*H05B 37/02* (2006.01)
*H01J 9/00* (2006.01)

(52) U.S. Cl. ............... 315/152; 315/297; 315/308

(58) Field of Classification Search ........ 315/149–154, 315/291, 294, 295, 297, 307–309
See application file for complete search history.

(56) References Cited

U.S. PATENT DOCUMENTS

| | | |
|---|---|---|
| 4,538,214 A | 8/1985 | Fisher et al. |
| 4,920,467 A | 4/1990 | Honsberger |
| 5,010,463 A | 4/1991 | Ross |
| 5,404,282 A | 4/1995 | Klinke et al. |
| 5,721,471 A | 2/1998 | Begemann et al. |
| 6,016,038 A | 1/2000 | Mueller et al. |
| 6,150,774 A | 11/2000 | Mueller et al. |
| 6,183,104 B1 | 2/2001 | Ferrara |
| 6,234,645 B1 | 5/2001 | Borner et al. |
| 6,241,527 B1 | 6/2001 | Rast |
| 6,255,786 B1 | 7/2001 | Yen |
| 6,441,558 B1 | 8/2002 | Muthu et al. |
| 6,515,314 B1 | 2/2003 | Duggal et al. |
| 6,565,231 B1 | 5/2003 | Cok |
| 6,608,453 B2 | 8/2003 | Morgan et al. |
| 6,661,029 B1 | 12/2003 | Duggal |
| 6,683,665 B1 | 1/2004 | Matthies |
| 6,697,262 B2 | 2/2004 | Adams et al. |
| 6,776,496 B2 | 8/2004 | Cok |
| 6,777,891 B2 | 8/2004 | Lys et al. |
| 6,806,659 B1 | 10/2004 | Mueller et al. |
| 6,846,093 B2 | 1/2005 | Swaris et al. |

(Continued)

FOREIGN PATENT DOCUMENTS

CA 2549232 12/2006

(Continued)

OTHER PUBLICATIONS

IB of WIPO, International Preliminary Report on Patentability and Written Opinion, PCT/US2009/054224, May 17, 2010, 19 pages.

(Continued)

*Primary Examiner* — Don Le
(74) *Attorney, Agent, or Firm* — Foley & Lardner LLP

(57) ABSTRACT

A lighting system includes a plurality of organic light emitting diode (OLED) devices. By selecting the plurality of OLED devices, or by selectively controlling the plurality of OLED devices, the color characteristics of the lighting system can be tuned. The lifetime of the lighting system can be improved.

39 Claims, 14 Drawing Sheets

U.S. PATENT DOCUMENTS

| | | | |
|---|---|---|---|
| 6,897,624 B2 | 5/2005 | Lys et al. | |
| 6,995,519 B2 * | 2/2006 | Arnold et al. | 315/169.3 |
| 7,012,585 B2 | 3/2006 | Agostinelli et al. | |
| 7,014,336 B1 | 3/2006 | Ducharme et al. | |
| 7,038,398 B1 | 5/2006 | Lys et al. | |
| 7,064,498 B2 | 6/2006 | Dowling et al. | |
| 7,108,392 B2 | 9/2006 | Strip et al. | |
| 7,108,396 B2 | 9/2006 | Swaris et al. | |
| 7,135,824 B2 | 11/2006 | Lys et al. | |
| 7,145,125 B2 | 12/2006 | May et al. | |
| 7,148,470 B2 | 12/2006 | Rains, Jr. et al. | |
| 7,157,694 B2 | 1/2007 | May et al. | |
| 7,161,313 B2 | 1/2007 | Piepgras et al. | |
| 7,175,296 B2 | 2/2007 | Cok | |
| 7,178,941 B2 | 2/2007 | Roberge et al. | |
| 7,186,003 B2 | 3/2007 | Dowling et al. | |
| 7,204,622 B2 | 4/2007 | Dowling et al. | |
| 7,207,693 B2 | 4/2007 | Ratcliffe | |
| 7,241,043 B1 | 7/2007 | Wu et al. | |
| 7,255,624 B2 | 8/2007 | Daftari | |
| 7,259,391 B2 | 8/2007 | Liu et al. | |
| 7,262,753 B2 | 8/2007 | Tanghe et al. | |
| 7,303,305 B2 | 12/2007 | Kennedy | |
| 7,306,353 B2 | 12/2007 | Popovich et al. | |
| 7,329,027 B2 | 2/2008 | Phelan et al. | |
| 7,334,917 B2 | 2/2008 | Laski | |
| 7,348,738 B2 | 3/2008 | Foust et al. | |
| 7,354,172 B2 | 4/2008 | Chemel et al. | |
| 7,365,991 B2 | 4/2008 | Aldrich et al. | |
| 7,374,311 B2 | 5/2008 | Rains, Jr. et al. | |
| 7,387,403 B2 | 6/2008 | Mighetto | |
| 7,387,405 B2 | 6/2008 | Ducharme et al. | |
| 7,387,406 B2 | 6/2008 | Swaris et al. | |
| 7,554,257 B2 * | 6/2009 | Krummacher et al. | 313/501 |
| 8,110,835 B2 * | 2/2012 | Kumar et al. | 257/79 |
| 2001/0000005 A1 | 3/2001 | Forrest et al. | |
| 2002/0068191 A1 | 6/2002 | Kobayashi | |
| 2003/0052616 A1 | 3/2003 | Antoniadis et al. | |
| 2003/0067775 A1 | 4/2003 | Nagai et al. | |
| 2003/0080678 A1 | 5/2003 | Kim et al. | |
| 2004/0032205 A1 | 2/2004 | Hack et al. | |
| 2004/0042199 A1 | 3/2004 | Cok | |
| 2004/0132344 A1 | 7/2004 | Plishner | |
| 2004/0178743 A1 | 9/2004 | Miller et al. | |
| 2004/0195967 A1 | 10/2004 | Padiyath et al. | |
| 2005/0012103 A1 | 1/2005 | Peng | |
| 2005/0110384 A1 | 5/2005 | Peterson | |
| 2005/0134525 A1 | 6/2005 | Tanghe et al. | |
| 2005/0134526 A1 | 6/2005 | Willem et al. | |
| 2005/0207165 A1 | 9/2005 | Shimizu et al. | |
| 2005/0248935 A1 * | 11/2005 | Strip et al. | 362/145 |
| 2006/0038752 A1 * | 2/2006 | Winters | 345/76 |
| 2006/0043912 A1 | 3/2006 | Foust et al. | |
| 2006/0044215 A1 | 3/2006 | Brody et al. | |
| 2006/0053527 A1 | 3/2006 | Schneider | |
| 2006/0077669 A1 | 4/2006 | Thielemans et al. | |
| 2006/0109219 A1 | 5/2006 | Robinson et al. | |
| 2006/0125410 A1 * | 6/2006 | Duggal et al. | 315/169.3 |
| 2006/0126338 A1 | 6/2006 | Mighetto | |
| 2006/0197456 A1 | 9/2006 | Cok | |
| 2006/0232524 A1 * | 10/2006 | Cok | 345/82 |
| 2006/0232962 A1 | 10/2006 | Altman | |
| 2006/0245213 A1 | 11/2006 | Beil et al. | |
| 2006/0262544 A1 | 11/2006 | Piepgras et al. | |
| 2006/0285361 A1 | 12/2006 | Cok | |
| 2007/0064425 A1 | 3/2007 | Frecska et al. | |
| 2007/0098334 A1 | 5/2007 | Chen | |
| 2007/0125368 A1 | 6/2007 | Silverstein | |
| 2007/0178771 A1 | 8/2007 | Goetz et al. | |
| 2007/0188427 A1 | 8/2007 | Lys et al. | |
| 2007/0215870 A1 | 9/2007 | Nam | |
| 2007/0263394 A1 | 11/2007 | Thielemans et al. | |
| 2007/0273290 A1 | 11/2007 | Ashdown et al. | |
| 2007/0274084 A1 | 11/2007 | Kan et al. | |
| 2008/0002399 A1 | 1/2008 | Villard et al. | |
| 2008/0080163 A1 | 4/2008 | Grote et al. | |
| 2008/0087464 A1 | 4/2008 | Patterson et al. | |
| 2008/0088648 A1 | 4/2008 | Nathan et al. | |
| 2008/0237981 A1 | 10/2008 | Gilles et al. | |
| 2009/0086478 A1 | 4/2009 | Sanroma et al. | |
| 2011/0248244 A1 * | 10/2011 | Ali et al. | 257/40 |

FOREIGN PATENT DOCUMENTS

| | | |
|---|---|---|
| CA | 2568430 | 10/2007 |
| CA | 2604364 | 3/2008 |
| DE | 8801246 | 3/1988 |
| DE | 202006006417 | 11/2006 |
| EP | 1391918 | 2/2004 |
| EP | 1408722 | 4/2004 |
| EP | 1457962 | 9/2004 |
| EP | 1367675 | 7/2006 |
| FR | 2836985 | 9/2003 |
| JP | 1222610 | 9/1989 |
| JP | 6-214509 | 8/1994 |
| JP | 2004363421 | 12/2004 |
| JP | 2006-278307 | 10/2006 |
| JP | 2007-172918 | 7/2007 |
| JP | 2008307084 | 12/2008 |
| TW | 256026 | 6/2006 |
| WO | WO 2003/044297 | 5/2003 |
| WO | WO 2005/101513 | 10/2005 |
| WO | WO 2006/043943 | 4/2006 |
| WO | WO 2006/056066 | 6/2006 |
| WO | WO 2006/063212 | 6/2006 |
| WO | WO 2006/097763 | 9/2006 |
| WO | WO 2006/122392 | 11/2006 |
| WO | WO 2006/123335 | 11/2006 |
| WO | WO 2007/107916 | 9/2007 |
| WO | WO 2007/144365 | 12/2007 |
| WO | WO 2008/001274 | 1/2008 |
| WO | WO 2008/012702 | 1/2008 |
| WO | WO 2008/019487 | 2/2008 |
| WO | WO 2008/037450 | 4/2008 |
| WO | WO 2008/040323 A2 | 4/2008 |
| WO | WO 2008/063864 | 5/2008 |
| WO | WO 2008/068718 | 6/2008 |
| WO | WO 2008/071206 | 6/2008 |
| WO | WO 2008/099306 | 8/2008 |
| WO | WO 2008/157723 | 12/2008 |
| WO | WO 2009/115955 | 9/2009 |

OTHER PUBLICATIONS

IB of WIPO, International Preliminary Report on Patentability and Written Opinion, PCT/US2009/054231, Apr. 23, 2010, 18 pages.
IB of WIPO, International Preliminary Report on Patentability and Written Opinion, PCT/US2009/054232, May 17, 2010, 19 pages.
IB of WIPO, International Preliminary Report on Patentability and Written Opinion, PCT/US2009/054228, Jun. 2, 2010, 21 pages.

* cited by examiner

ORGANIC LIGHT EMITTING DIODE LIGHTING SYSTEMS

CROSS-REFERENCE TO RELATED APPLICATIONS

This application claims priority to U.S. Provisional Patent Application No. 61/090,150, filed on Aug. 19, 2008, and U.S. Provisional Patent Application No. 61/102,326, filed on Oct. 2, 2008, the complete disclosures of both applications being hereby incorporated by reference in their entirety.

BACKGROUND

Organic light emitting diodes (OLEDs) can utilize organic small molecules or polymers that produce light when transferred into their excited state by an external power source. Accordingly, OLED devices may be referred to as polymer light emitting diode (PLED) devices or small molecule organic light emitting diode (SMOLED) devices depending on their active compositions. Depending on the driven mechanisms of the OLEDs, sometimes the terminologies of active matrix OLED (AMOLED) and passive matrix OLED (PMOLED) are used.

Earlier OLEDs were typically based on relatively simple structures, where a thin layer of the electroluminescence (EL) conjugated polymer was enclosed between a pair of electrodes. When a voltage is applied to the electrodes, the positive (anode) and the negative (cathode) electrodes can provide injection of holes and electrons, respectively, into the EL polymer. In the EL polymer layer, electrons and holes move towards each other in the applied electrical field and form excitons, which are bound excited states that can relax down into the ground state radiatively by emitting a photon. This process can be referred to as electroluminescence. OLED devices are of interest in, for example, display, signage, and lighting.

OLEDs were first designed in the 1980s, see, e.g., C. W. Tang, S. A. Van Slyke, Organic electroluminescent diodes, Appl. Phys. Lett. 1987, 51, 913. More recent developments in OLED materials and applications are generally described in Kraft et al., *Angew. Chem. Int. Ed.,* 1998, 37, 402-428, and Z., Li and H. Meng, *Organic Light-Emitting Materials and Devices* (Optical Science and Engineering Series), CRC Taylor & Francis (Sep. 12, 2006). The disclosures of these references are incorporated by reference in their entirety.

SUMMARY

Described herein are embodiments which include, among other things, devices, articles, instruments, apparatuses, kits, systems, and the like, and methods of making and methods of using same. More specifically, the various embodiments described in this application generally relate to lighting emitting systems comprising light emitting diode (LED) devices. In particular, the embodiments are related to the use of organic light emitting diodes (OLED) in lighting systems.

In one aspect, a lighting system is provided including a plurality of OLED devices, and a controller configured to selectively drive at least some of the plurality of OLED devices at different activation levels. The controller may be configured to selectively drive the OLED devices to different activation levels to increase a lifetime of the lighting system. In another aspect, the controller may be configured to selectively drive the OLED devices to different activation levels such that an output light from the lighting system has a desired color characteristic. At least one of the plurality of OLED devices has at least one coupler configured to electrically couple the OLED device to a power supply and an encapsulation that isolates the OLED device from an ambient environment.

In another aspect, a lighting system is provided. The lighting system has a plurality of OLED devices, wherein each of the plurality of OLED devices has an active region. In this aspect, at least some of the OLED devices have active regions of different sizes, and the different sizes are selected such that light emitted from the lighting system has desired color characteristics. In this aspect, OLED devices having active regions of different sizes have substantially matching lifetimes.

In another aspect, a method is provided comprising selectively controlling activation levels of at least some of a plurality of OLED devices in a lighting system to improve a lifetime of the lighting system.

In another embodiment, the method includes selecting a subset of OLED devices from a plurality of pre-manufactured modular OLED devices and coupling the selected subset of OLED devices to a mount. The subset of OLED devices is selected to have a mixed output light spectrum with desired color characteristics.

In another embodiment, a kit is provided. The kit has a plurality of OLED devices and a plurality of couplers. At least one of the plurality of couplers is configured to electrically couple at least one of the plurality of OLED devices to a power supply.

At least one advantage from at least one embodiment is that the OLED lighting system can have easily tunable color characteristics. This can be achieved in a "low cost" approach by replacing the individual OLED devices, or in a more flexible approach by selectively controlling the OLED devices using a controller.

At least another advantage from at least one embodiment is that the lifetime of the lighting system can be improved. This can be achieved, for example, by replacing individual OLED devices, providing redundancy, or selectively controlling the OLED devices using a controller for wear leveling.

DETAILED DESCRIPTION

Introduction

All references cited in this application are hereby incorporated by reference in their entirety. In particular, the disclosures of U.S. Provisional Patent Application No. 61/090,150, filed on Aug. 19, 2008, and U.S. Provisional Patent Application No. 61/102,326, filed on Oct. 2, 2008, are hereby incorporated by reference in their entirety.

The use of organic materials in electroluminescent devices offers several desirable properties, for example, increased luminescence of the device; lower threshold voltage; ease of processability of materials and components during device fabrication; the ability to use spin casting, drop casting, and printing techniques to apply different layers in electroluminescent devices; the ability to prepare flexible electroluminescent devices; the ability to prepare low-weight electroluminescent devices; and the ability to prepare low-cost electroluminescent devices.

An electroluminescent device generally can be a device that converts electrical current to electromagnetic radiation. In particular, OLEDs provide an efficient way to produce light at low voltage and minimal radiant heat. These devices currently find uses in many consumer electronics such as displays, signage, and lighting. OLEDs are generally known in the art as described in, for example, Organic Light-Emitting Materials and Devices, edited by Li and Meng, 2007.

Lighting System

Figure 1A:
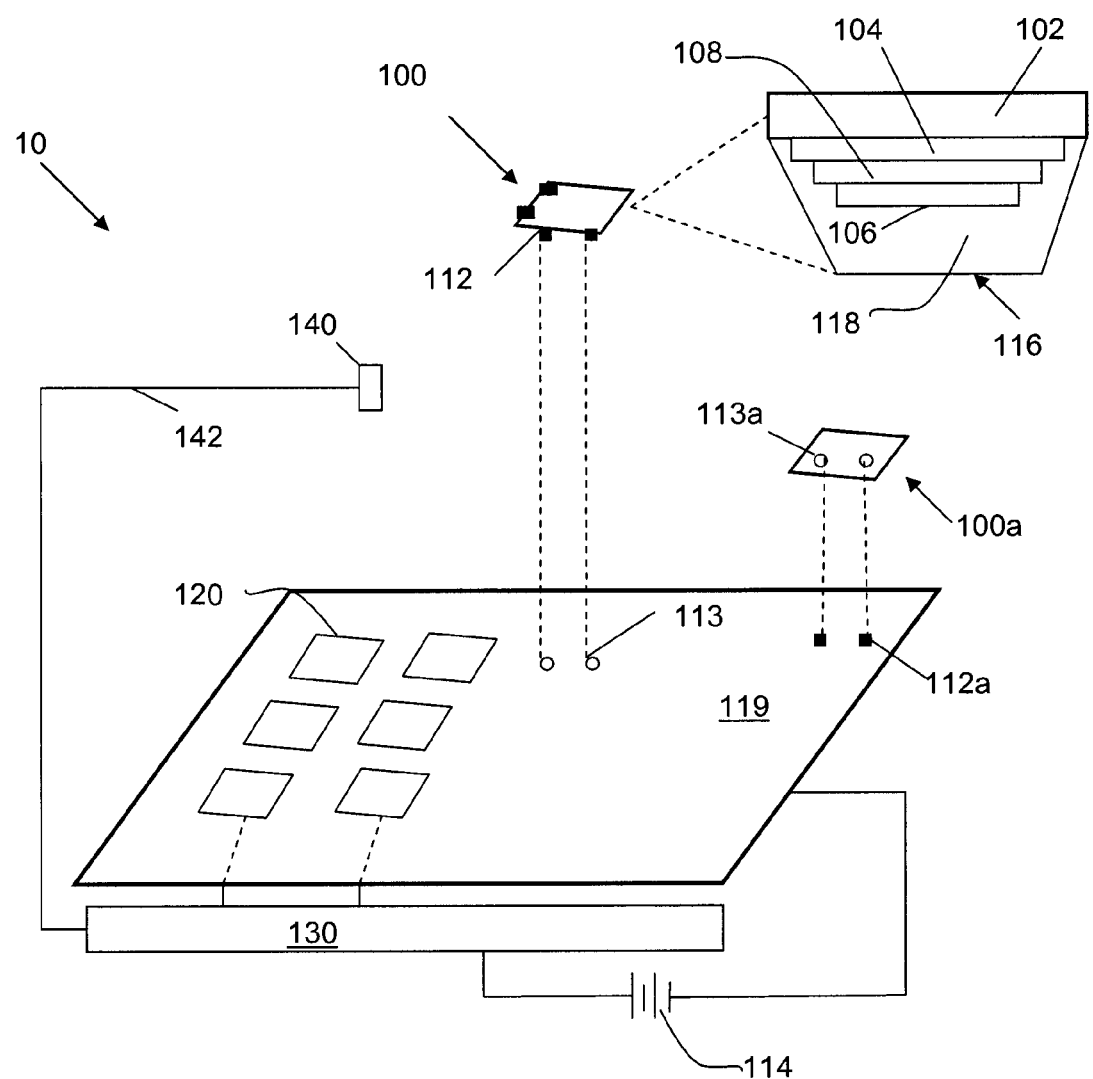
FIG. 1A is a perspective view of an example OLED device implemented in an example lighting system.

An example lighting system 10 is illustrated in FIG. 1A. The lighting system 10 comprises a plurality of OLED devices 100. The plurality of OLED devices are selected such that the lighting system 10 emits light with a predetermined color characteristic. A desired color characteristic can be one of a color temperature or a color rendering index. For example, by selectively mixing OLED devices of different colors, the light output from the light emitting system 10 can be substantially white. In addition, the light output from the light emitting system 10 can be tunable based on user preferences. Thus, the lighting system 10 is a configurable system.

In one embodiment, at least some of the OLED devices emit light of different colors, and wherein the colors are selected from, for example, red, green, blue, white, and the like. In this application, the phrase "at least some" of the OLED devices refers to two or more OLED devices. At least one of the OLED devices is removable, and the system is also expandable to have more OLED devices "plugged in." Thus, the color of the output light from the lighting system, which is a mix of those of individual OLED devices, is changeable by selectively replacing at least a subset of OLED devices.

OLED Devices

An example OLED device 100 is illustrated in FIG. 1A as part of a lighting system 10. The OLED device 100 can comprise a substrate 102, an anode 104, a cathode 106, and an active region 108. An inverted OLED structure can also be used. For example, a bottom cathode can be disposed over a substrate, followed by an active region and anode.

The active region 108 comprises an organic material, and is electrically coupled to the anode 104 and the cathode 106. The active region 108 is configured to emit a broadband emission spectrum with a full width at half maximum (FWHM) larger than about 50 nm.

The OLED device 100 can have a plurality of couplers 112 configured to couple the OLED device 100 to a mount 119 through indentations 113. The couplers 112 can be mechanical couplers, or can be used to electrically couple at least one of the anode 104 or the cathode 106 to a power supply 114. In one embodiment, the couplers 112 are used for both electrical coupling and mechanical coupling.

In some embodiments, OLED device 100a can be provided having one or more indentations 113a, and the mount 119 can have attached couplers 112a configured to couple the OLED device 100a to the mount 119. As described further below, in some other embodiments, standalone couplers can be provided to couple the OLED devices with a mount or with each other.

The OLED device 100 also can have an encapsulation 116 that isolates the active region 108 from an ambient environment. In particular, the encapsulation 116 prevents water vapor and oxygen from entering the enclosure 118 to interact with the organic material in the active region 108. With the couplers 112 and the encapsulation 116, the OLED device 100 may be readily used as a standalone device, or may be dropped in a lighting system to replace another device.

The couplers 112 may be configured to electrically couple at least one of the anode 104 or the cathode 106 with the power supply 114 via a mount 119. The mount 119 is sometimes referred to as the "system substrate," which provides a frame onto which the lighting system can be built. In addition to mechanical support, the mount 119 can also provide electrical paths for the OLED devices. The mount 119 may be flat or curved. The mount 119 can be flexible, and the resulting lighting system can be flexible in shape. The mount 119 may comprise one or more rails to which OLED devices are slidably coupled.

Some of the couplers 112 may be configured to electrically couple at least one of the anode 104 or the cathode 106 with the power supply 114 via a second OLED device 120. By selecting a plurality of OLED devices, a lighting system may be assembled with a desired color, pattern, area, and brightness.

In addition to the electrical coupling, the couplers 112 may also mechanically couple the OLED device with the mount 119 or with the second OLED device 120.

The mount may be configured to be free-standing, ceiling mounted, or wall mounted. Since OLEDs are Lambertian emitters, the mount needs not be designed to mix the light of OLEDs of various emission spectra.

Substrate

Substrates are generally known in the art. Descriptions of various substrates may be found in, for example, Z., Li and H. Meng, Organic Light-Emitting Materials and Devices (Optical Science and Engineering Series). The substrate 102 of the OLED device 100 can be, for example, a solid substrate or a flexible substrate. The substrate can comprise, for example, an inorganic material or an organic material. The substrate can be, for example, made from glass, metal foil, or plastic. The substrate can be, for example, flats or can have a curvature in one or more dimensions. The substrate can be, for example, rigid, flexible or conformable. The substrate can be, for example, transparent, semi-transparent, translucent, or opaque.

Anode

Anodes are generally known in the art. The anode 104 of the OLED device 100 can be transparent to the light emitted from the OLED device 100. The anode 104 may comprise, for example, a transparent conductive oxide (TCO). Examples of TCOs include indium tin oxide (ITO), ZnO, and the like. ITO in the form of thin layers (e.g., about 100 nm thick) is substantially transparent to visible light. Substantially transparent layers desirably allow a visible light transmission of about 70% or more. ITO has a relatively high work function that helps the injection of holes into the active region 108. The ITO may be coated on a glass or plastic substrate.

In some other embodiments, anodes can be thin and somewhat transparent, or comprise thick and highly reflective metal.

Cathode

Cathodes are generally known in the art. The cathode 106 of the OLED device 100 can also be transparent. The cathode 106 may comprise, for example, a thin metal film such as aluminum or calcium, or a non-metal conductive layer. The cathode 106 typically has a relatively low work function to help injecting electrons into the active region 108. The cathode 106 can be at least 100-200 nm thick.

Active Region

The active region refers generally to the region where electrons and holes recombine to radiate photons. In the claimed embodiments, the active region comprises an organic material, and the radiative photon energy may correspond to the energy difference between the lowest unoccupied molecular orbital (LUMO) level and the highest occupied molecular orbital (HOMO) level of the organic material. Photons of lower energy/longer wavelength may be generated by higher-energy photons through fluorescent or phosphorescent processes.

The active region can comprise multiple layers, for example, a combination of p- and n-type layers. The p- and n-type materials may be bonded to each other. The bonding can be ionic or covalent bonding. The multiple layers of the active region may form heterostructures therebetween.

The active region may be manufactured by known methods including, for example, spin casting, drop casting, slot die coating, vapor deposition or sputtering, crystalline growth, patterned etching, dip coating, or by printing techniques such as ink jet printing, off-setting, transfer processes, or by spray applications.

Organic Material

The organic material in the active region 108 may include an electroluminescent polymer. The polymer may be a fluorescent emitter, or a phosphorescent emitter or a combination of fluorescent and phosphorescent emitters. The polymer may include, for example, poly-phenylene vinylene, or polyfluorene. The polymers are often engineered to substitute side chains onto the backbone to tune the color or to improve the processing of the polymers.

Alternative to a polymer emitter, a small molecule emitter comprising for example, organo-metallic chelates or conjugated dendrimers, may be used.

The organic material may be doped with phosphorescent materials.

Electrical Coupling

The electrical coupling between the active region 108 and the anode 104 or cathode 106 may be a direct-contact coupling, or through more layers as discussed in detail below.

Power Supply

The power supply 114 may comprise a battery, an adapter, or may be part of a power grid. The OLED devices may be powered by AC or DC current.

Feedback

A feedback mechanism may be provided for a controller 130 to control the lighting system 10 or the OLED devices 120. The feedback mechanism may include, for example, a sensor 140 for sensing a luminance of one or more of the OLED devices. The output from the sensor 140 is then fed back to the controller 130. Based on the feedback, the controller 130 may control the drive current or drive voltage of individual OLED devices or the lighting system 10 to adjust a color or a luminance of light emission, or some other characteristic of the output light. Although a feedback data line 142 in the form of a wire is shown to transmit feedback data from the sensor 140 to the controller 130, those of ordinary skill in the art will recognize that wireless transmission may be used.

In addition to the remote sensor 140 shown in FIG. 1A, one or more sensors may be located adjacent to individual OLED devices to measure, for example, a measured current, a capacitance or a junction temperature. These parameters can also be fed back to the controller 130 to control the lighting system 10.

Controller

The lighting system 10 may comprise the controller 130. The controller 130 may include a processor and memory. Each of the individual OLED devices may be assigned a logical address, and the control circuit individually controls the OLED devices based on their logical addresses. The controller 130 may individually address and control the OLED devices to adjust the color, pattern, brightness, or to compensate for aging.

Instead of changing the output color of the lighting system 10 by selectively coupling different OLED devices 120 onto the mount 119 as discussed above, a color of the emitted light from the lighting system can also be tunable by selectively driving at least one of the plurality of OLED devices differently from other OLED devices.

Selectively driving some of the plurality of OLED devices differently from other OLED devices may be realized by, for example, selectively varying a drive voltage or a drive current of the OLED devices.

Figure 1B:
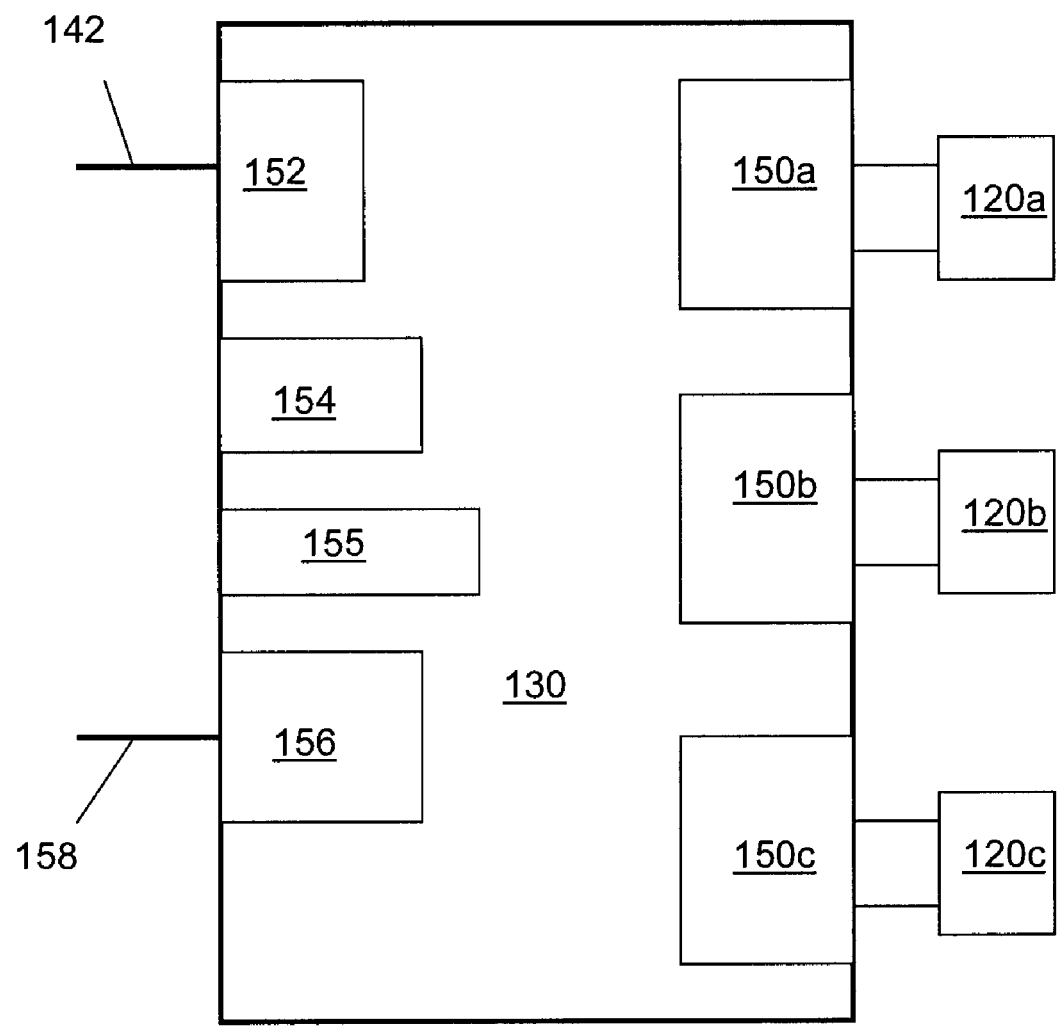
FIG. 1B is a block diagram of an example controller for controlling the lighting system.

A simplified block diagram of a controller 130 according to one embodiment is shown in FIG. 1B. As shown, the plurality of OLED devices 120*a*, 120*b*, 120*c* can be controlled by the controller 130 through digital-to-analog converters (DAC) 150*a*, 150*b*, and 150*c*, respectively. The OLED devices 120*a*, 120*b*, 120*c* can have different colors, such as red, green, and blue, respectively. The DAC 150*a*, 150*b*, 150*c* can deliver drive current pulses of suitable amplitudes and widths to their respective OLED devices 120*a*, 120*b*, and 120*c*. The OLED devices 120*a*, 120*b*, 120*c* can be driven independently, collectively, or interdependently.

The controller 130 can further comprise an input/output (I/O) interface 152 to receive the feedback data from the sensor 140 through the feedback data line 142. Memory 154 can be included in the controller 130 to store commands to generate drive sequences. A clock 155 can be used to synchronize the drive sequences. The controller 130 can further comprise a data port 156 to receive command data from data line 158, and the command data can come from a user, a processor, or a computer. The controller 130 can further comprise other components generally known in the art, such as shift registers.

The controller 130 can be implemented using, for example, a computer with suitable control software and additional discrete components, or using an application specific integrated circuit (ASIC).

Coupler

The OLED device in accordance with the claimed embodiments may comprise a coupler for coupling the OLED device with a mount or with one or more other OLED devices. The resulting OLED device is pre-manufactured in a modular fashion such that the OLED device may be a "plug-and-play" device. The OLED device can be readily "plugged in" to a system to reconfigure the color, appearance, brightness, or other properties of the system, or replace an existing OLED device in the system. The coupler can provide mechanical or electrical coupling. In addition, the coupler can provide a combination of electrical and mechanical coupling.

In the embodiment shown in FIG. 1A, the couplers 112 include those for coupling the OLED device 100 onto a mount 119, and those that can be configured to couple to one or more other OLED devices.

Figure 2A:
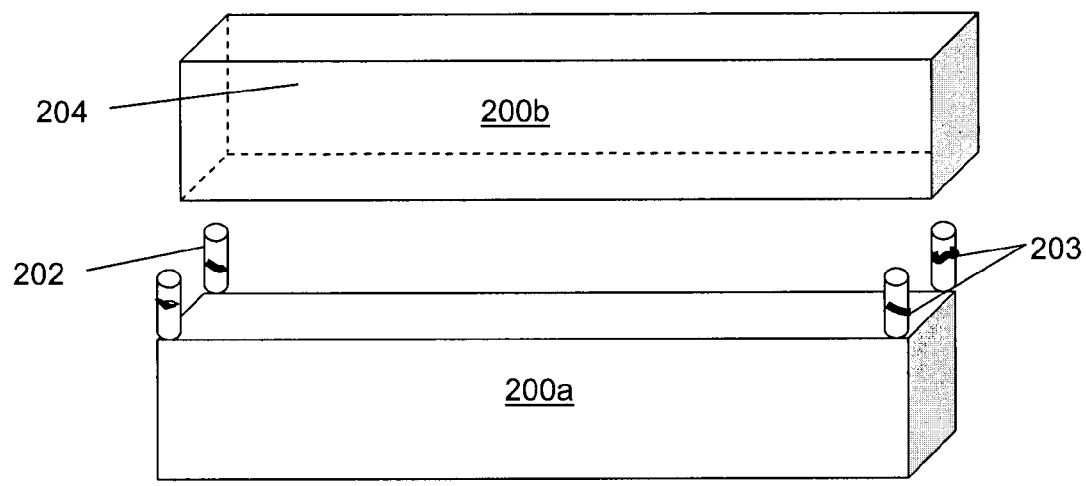
FIGS. 2A-2D are perspective views of example OLED device couplers.

In one embodiment as illustrated in FIG. 2A, a coupler 200a may comprise a plurality of protrusions 202 configured to couple to a complementary opening or indentation 204 in a corresponding coupler 200b. The lateral dimension of the opening 204 substantially matches the spacing of the protrusions 202. The indentations may be holes or slots in the OLED device. The protrusions 202, or the coupler 200b, or both, may be slightly flexible. This can be achieved, for example, by making the couplers 200a and 200b using plastics. By plugging the protrusions 202 into the opening 204, a removable yet stable, coupling can be realized. The interlocking mechanism resembles that of the LEGO™ building blocks. The corresponding coupler 200b may be part of the mount, or part of a second OLED device. The protrusions 202 may have conductive and/or insulating patterns 203 disposed thereon, which may be electrically coupled to corresponding conductive regions (not shown) in the indentations 204 to make electrical connections when the couplers 200a, 200b are joined together. These conductive regions may be electrically connected to at least one of the anode or cathode or a power supply. The conductive regions of the couplers may be configured to provide an electrical connection between the OLED device electrodes and a power supply when corresponding couplers are joined.

Figure 2B:
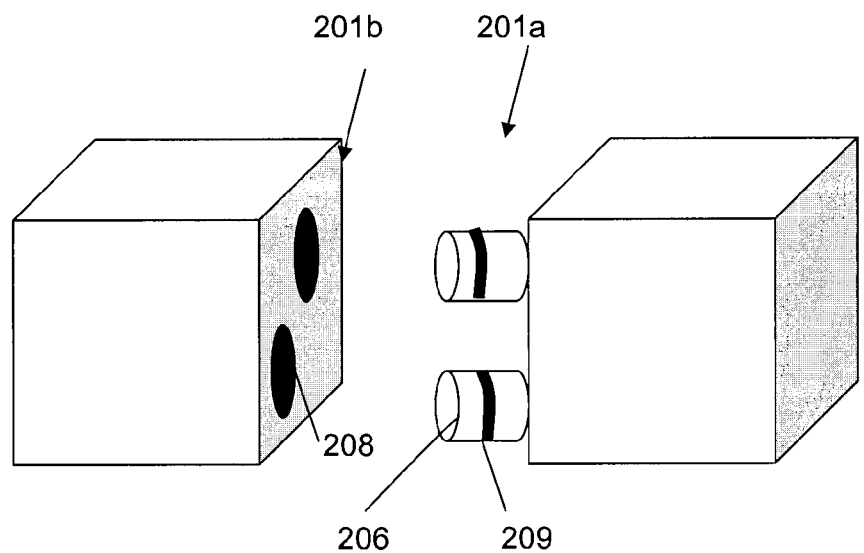

In one embodiment as illustrated in FIG. 2B, a coupler 201a may comprise one or more protrusions 206 configured to be coupled into corresponding indentations 208 in a corresponding coupler 201b. The protrusions 206 may have conductive patterns 209 disposed thereon, which may be electrically coupled to corresponding conductive regions (not shown) in the indentations 208 to make electrical connections when the couplers 201a, 201b are joined together. Thus, in addition to making the mechanical coupling, the couplers also function as electrical coupling.

Figure 2C:
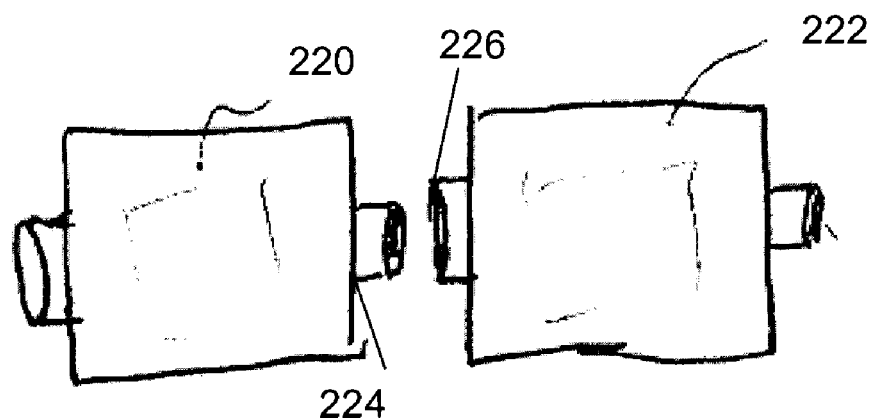

In one embodiment as illustrated in FIG. 2C, a plurality of substantially identical OLED devices 220, 222 can be matingly coupled using matching couplers 224, 226. For example, the outer diameter of the coupler 224 may be substantially the same as the inner aperture of the coupler 226, such that the coupler 224 may be snugly fit into the coupler 226. A large number of OLED devices can thus be coupled, mechanically and/or electrically, to form a lighting system.

Figure 2D:
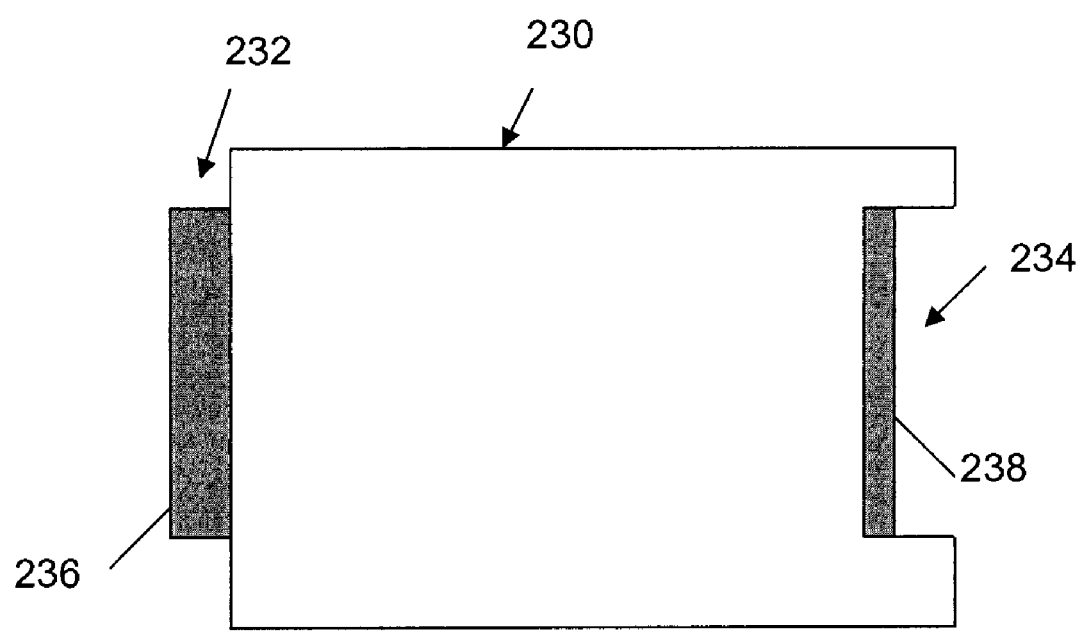

In another embodiment as illustrated in FIG. 2D, an OLED device 230 has protrusion portion 232 and indentation portion 234 fitted with metal inserts 236, 238, respectively. The metal inserts 236, 238 can be coupled to the electrodes of the OLED device 230. Identical OLED devices can thus be matingly coupled to each other while the metal inserts 236, 238 form electrical connections. The metal inserts 236, 238 can be spring loaded to facilitate the mechanical coupling.

In the embodiments shown in FIGS. 1A-2D, the couplers are attached to, or are part of, the OLED devices. As discussed below, in some other embodiments, couplers may be provided separately from the OLED devices and may be provided as part of a kit for assembling OLED devices into a lighting system.

Encapsulation

The OLED device may be already packaged in an encapsulation that protects the organic material of the OLED device from the ambient environment. The resulting OLED device may thus be a standalone device that can be readily installed in a system which does not necessarily provide oxygen and water vapor barriers.

Encapsulation may comprise barrier layers such as single or multi-layer barrier films such as Barix. Methods of coverage may include lamination, vapor deposition, or solution deposition. Furthermore, the encapsulation may comprise a sealant and a barrier structure such as a barrier film or housing. Desiccant materials may be contained within the encapsulation.

Figure 3:
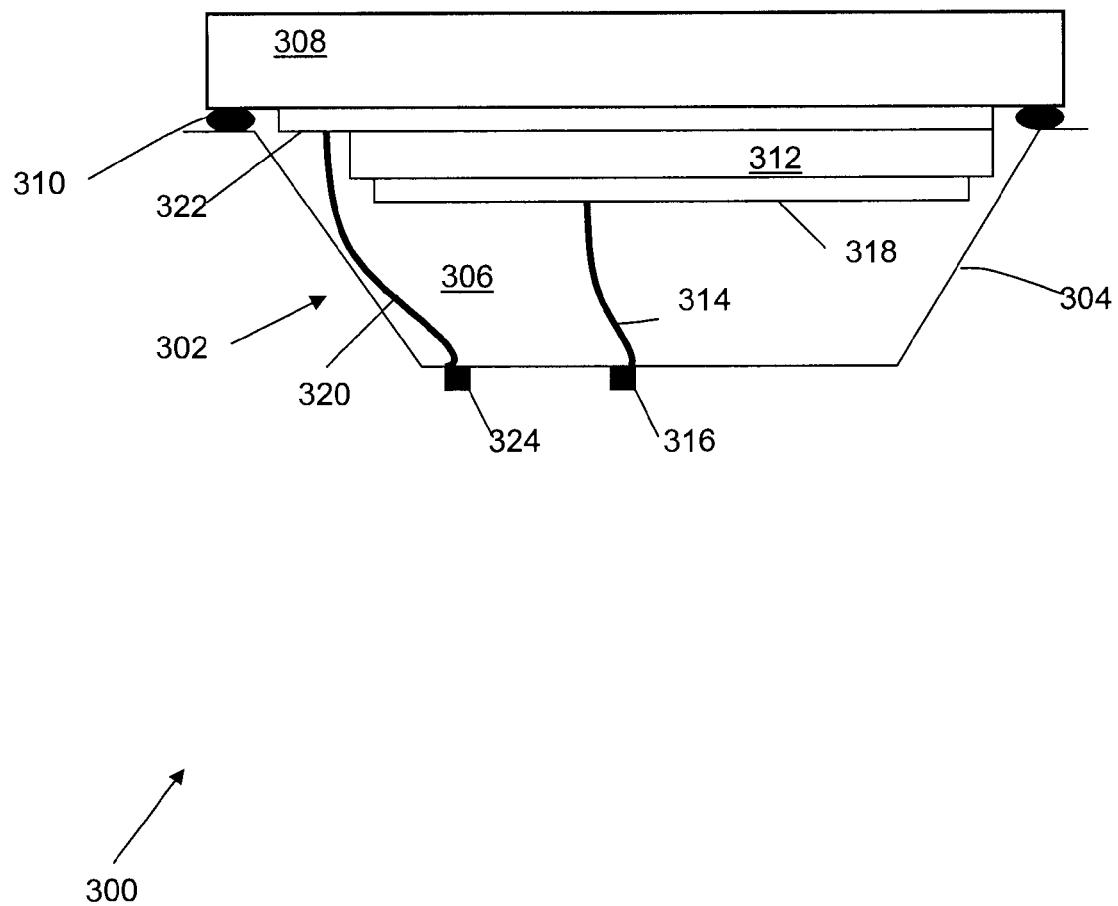
FIG. 3 is a cross-sectional view of an example OLED device packaged in an encapsulation.

An encapsulation 302 of an OLED device 300 is illustrated in FIG. 3. The encapsulation 302 comprises a housing 304 forming an enclosure 306 with the substrate 308. A first sealant 310 is disposed between the housing 304 and the substrate 308, and forms an oxygen and water vapor barrier for the active region 312. The first sealant comprises, for example, Mylar™ coated with metal.

The housing may have a first electrically conductive path 314 disposed in a first hermetic seal 316 through the housing 304. The first electrically conductive path 314 may be electrically coupled to the cathode 318.

The housing 304 may further have a second electrically conductive path 320 through the housing 304 via a second hermetic seal 324. The second electrically conductive path 320 may be electrically coupled to the anode 322. In this case, the housing 304 may comprise a non-conductive material.

In another embodiment, the housing 304 may be electrically conductive. For example, the housing 304 may comprise a metal, such as aluminum, or a conductive plastic. In this case, the first electrically conductive path 314 is electrically isolated from the housing 304. Instead of using the second electrically conductive path 320 through the housing 304, the anode 322 may be electrically coupled to the housing 304 through the first sealant 310 which in this case is conductive.

The electrically conductive housing 304 may thus form a common anode with neighboring OLED devices.

Housing

Figure 4:
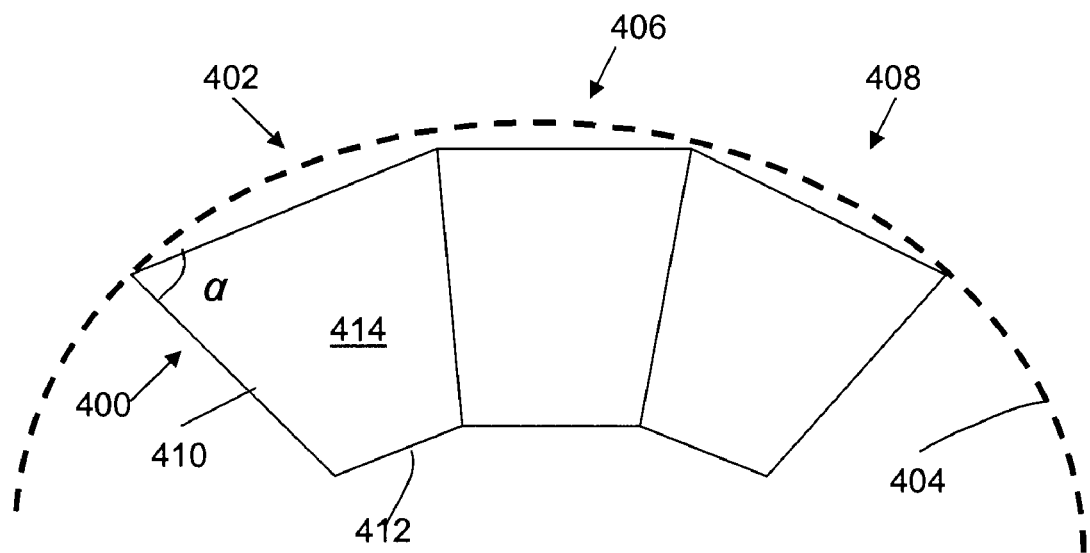
FIG. 4 is a cross-sectional view of a plurality of packaged OLED devices tightly arranged on a curved surface.

As shown in FIG. 4, the housing 400 has a contoured shape that allows the OLED device 402 to be arranged on a curved surface 404 with a plurality of neighboring OLED devices 406, 408 without causing substantial interference between housings of neighboring OLED devices.

In one embodiment, the housing 400 has a slanted side wall 410 and a bottom wall 412, and wherein a slant angle α of the slanted side wall 410 is selected such that, when the OLED device 402 is tightly arranged with a plurality of neighboring OLED devices 406, 408 on the curved surface 404, housings of neighboring OLED devices do not substantially interfere with each other. For example, when the slant angle α is about 60°, two neighboring OLED devices 402, 406 may be arranged on a curved surface with such a curvature that the OLED devices 402, 406 form an inward angle of about 120°, while the neighboring sidewalls do not exert pressure on each other. In some embodiments, the slant angle α is in the range between about 30° and 90°. Accordingly, the individual devices 402, 406, 408 can be substantially flat and rigid, while mosaics of such devices can cover curved surfaces of different curvatures.

The enclosure 414 formed between the housing 400 and the substrate may be filled with an inert gas, such as argon, at a pressure equal to or higher than an atmospheric pressure. This further helps prevent oxygen and water vapor from entering the enclosure 414. For example, the pressure may be between about 1.05 and 1.5 times the atmospheric pressure. The strength of the housing material and the active region material determines how high the pressure can be. In one embodiment, the pressure is about 1.1 times the atmospheric pressure.

In the top plan view, the housing 400 has a shape configured to improve the fill factor, i.e., the ratio between the light emitting area to the total area, of the OLED device. The shape of the housing 400 in the top plan view may be a circle, an oval, or polygonal. The housing 400 may be coated with a color or labeled with a symbol indicative of a light emission color of the active region, for example, red, green, blue, or white.

In some embodiments, the housing may comprise transparent plastic to allow light to pass therethrough. The housing may also be made of glass. The glass housing may be manufactured in a certain shape to improve light out coupling.

Polygonal OLED Devices

Figure 5A:
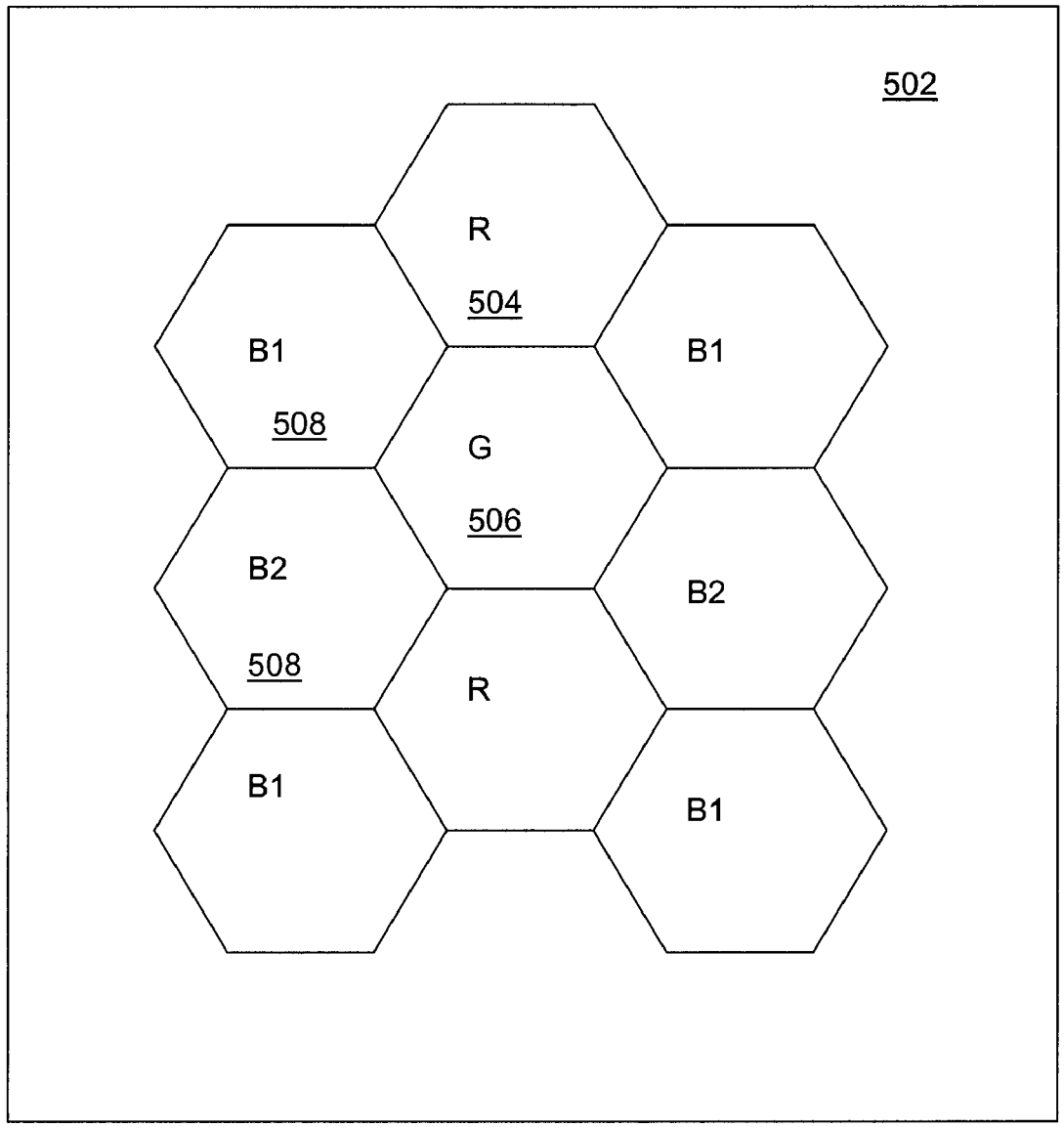
FIG. 5A is a top plan view of a plurality hexagonal OLED devices tightly arranged into a matrix.

In one exemplary embodiment, the housing may have a substantially polygonal shape, such as the hexagonal shape in the top plan view as shown in FIG. 5A. Thus, the OLED device 506 is configured to be neighboring six other polygonal OLED devices to form a tightly arranged mosaic.

A plurality of OLED devices, which are pre-manufactured and can be already packaged, are "plugged" or snuggly fit into a mount 502 and arranged in the pattern. In the embodiment shown in FIG. 5A, the modular OLED devices have hexagonal shapes to improve the density or fill factor of the lighting system. Those of ordinary skill in the art will recognize that other shapes can also be used. For example, by appropriately selecting and patterning the modular OLED devices of different shapes (e.g., pentagons, hexagons, and triangles) and sizes, a lighting system of complex 3-dimensional shapes, such as that of a geodesic dome, may be achieved.

Color Tuning

Advantageously as a result of the modular design discussed in this application, the individual OLED devices may be selected from a kit comprising devices with different color characteristics, sizes, and shapes.

At least one of the OLED devices is removably coupled to the mount 502, and the system is expandable to include more OLED devices. Accordingly, a mixed color of the emitted light from the lighting system is adjustable by selectively replacing at least a subset of OLED devices. For example, by replacing some of the blue OLED devices with red OLED devices, the color of the output light from the lighting system can be shifted toward a warmer color.

Alternatively, the individual OLED devices may be individually addressed and controlled using, for example, the controller 130 shown in FIGS. 1A and 1B. The color of the emitted light from the lighting system is tunable by selectively driving at least one of the plurality of OLED devices differently from other OLED devices. Driving the OLED devices differently may be realized by driving the OLED devices to different activation levels. Such activation levels may include, for example, voltage levels, current levels, on/off states, and pulse widths.

For example, a drive voltage or a drive current of some of the plurality of OLED devices may be selectively varied. By increasing the drive voltage or the drive current of the blue OLEDs, the overall output color of the lighting system is tuned toward a colder color temperature.

In another example, some of the OLED devices may be selectively turned on or off to adjust the output color and luminosity.

In yet another example, the OLED devices are driven in a pulse width modulation (PWM) method, where the activation levels of the OLED devices are determined by a drive pulse width. By selectively increasing the pulse width of, for example, some of the blue OLED devices, the output color of the lighting system is tuned toward a colder color temperature.

OLED Device Wearing

In order to drive an OLED device to emit light, an electrical current is passed through an active region or a light emitting layer of the device. One cause of "aging" or "wearing" of the device occurs when molecular bonds within the material making up the active region are broken or formed when photons, excitons, electrons and/or holes chemically interact with the material. The presence of oxidants or reductants may facilitate such aging or wearing. OLED devices that emit different colors, for example, have different wearing and aging characteristics or profiles. Blue OLEDs are generally known to age more quickly than red OLEDs, causing blue OLEDs to fail in a shorter period of time than red OLEDs under similar operating conditions.

Wear leveling refers to various approaches that can be undertaken to improve the overall aging profile of a collection of OLED devices even when the individual OLED devices within the collection have different aging profiles. A wearing level of an OLED device may be determined based on, for example, an accumulative duration that the OLED device has been previously activated. The prior activation history of the OLED device may be recorded in a memory device. The history may include, for example, drive voltage or current pulse width, frequency, amplitude, and accumulative duration.

In addition, the wearing level of the OLED device may be characterized by a measured current, a capacitance, a junction temperature, or a luminance of the OLED device. The current or the capacitance may be measured using the controller in conjunction with appropriate electrical circuitry. The parameters such as the junction temperature may be measured locally using a temperature sensor adjacent to, or embedded in, the active region. The luminance may be measured by an optical detector at a distance from the OLED device.

Expected Lifetime

When an OLED device has degraded to a predetermined level such that the OLED device emits light below a predetermined efficiency threshold, the OLED device is said to have reached its expected lifetime. Different types of OLED devices have expected lifetime of different lengths. For example, blue OLEDs typically have shorter lifetime because of the higher photon energy. The expected lifetime of conventional blue OLEDs is typically only about half that of red OLEDs or green OLEDs of the same size when operated at conditions such that a mixed light output has desired characteristics, e.g., at certain color coordinates in color space.

When a certain number of OLED devices reach their lifetime, the collection of OLED devices in the lighting system starts to have a significantly degraded performance, and the lighting system is said to have reached its own lifetime. In conventional lighting systems, the lifetimes of different types of OLED devices are not matched. For example, when blue OLED devices have reached their lifetime, OLED devices of other colors would be still usable. However, the color coordinates of the lighting system would have changed and reached its lifetime due to the degradation of the blue OLED devices.

As discussed below, lighting systems are provided with matching lifetimes of different types of OLED devices. In a "low cost" approach, the degraded OLED devices may be simply replaced, taking advantage of the modular design of the OLED devices and their couplings to the mount. In another approach, pre-installed redundant OLED devices in the lighting system can be activated to replace or augment the degraded devices. In yet another approach, the different types of OLED devices are provided with different sizes and/or different drive currents, thereby substantially matching their lifetimes and effectively expanding the lifetime of the lighting system.

Configurable Lighting System with Expanded Lifetime

In a lighting system, the plurality of OLED devices may include a first number of a first type of OLED devices and a second number of a second type of OLED devices. The first type of OLED devices have a spectrum (e.g., color) different from a spectrum of the second type of OLED devices. An individual OLED device may have its lifetime correlated to its emission spectrum. Typically an OLED of shorter emission wavelength has a shorter lifetime, as discussed above with respect to blue OLED devices. This may result from the fact that the photons of shorter wavelength are more energetic so that they break the bonds in the molecules of the active region faster than do the photons of longer wavelengths.

Accordingly, the numbers of different types of OLED devices may be selected to be inversely proportional to their expected lifetime. In one embodiment, the numbers of different types of OLED devices are selected based on their expected lifetime. For example, a two-to-one ratio between the number of blue OLEDs and the number of red OLEDs may be predetermined. This ratio is based on the expected average lifetime of the blue OLED being only half that of the red OLED or green OLED. Accordingly, in the system shown in FIG. 5A, for every red OLED device 504 or green OLED device 506, two blue OLED devices 508 are included.

In one embodiment, all the OLEDs may be simply driven by a common voltage and the blue OLEDs may be configured to have a higher resistance and thus a lower current. During the wearing/aging of the lighting system, the color and other optical characteristics such as the brightness are thus effectively controlled by the pre-selected numbers of different OLED devices. For example, the color coordinates of the light output from the lighting system can be maintained by including a larger number of blue OLED devices, or blue OLED devices of larger sizes as compared with red or green OLED devices, while reducing the operating current densities of these blue OLED devices. The individual OLED devices of different types have substantially matched lifetimes in the resulting lighting system.

Wear Leveling

In the case of replacing some of the OLED devices for color tuning or to replace the degraded devices, the newer OLED devices will have longer lifetime remaining as compared with older devices. That is, the different devices have different wearing levels, and the older devices or those devices that have been activated at higher levels have more wearing. Accordingly, a wear leveling method is provided to level out the wearing of different devices thereby expanding the lifetime of the lighting system.

For example, the OLED devices may be configured to be selectively activated to different levels. In one embodiment, at least some of the OLED devices are configured to be selectively turned on or off based on a lifetime of the at least some of the plurality of OLED devices. In particular, newer devices may be intentionally activated to higher activation levels. Activating to higher activation levels may include, for example, turning on the device for a longer period of time or at a higher frequency, or driving the device at a higher current density. On the other hand, those OLED devices of larger number, as discussed above, or of larger sizes, as discussed below, can be activated to lower activation levels to match their lifetimes with other OLED devices while maintaining the color coordinates of the lighting system.

Figure 5B:
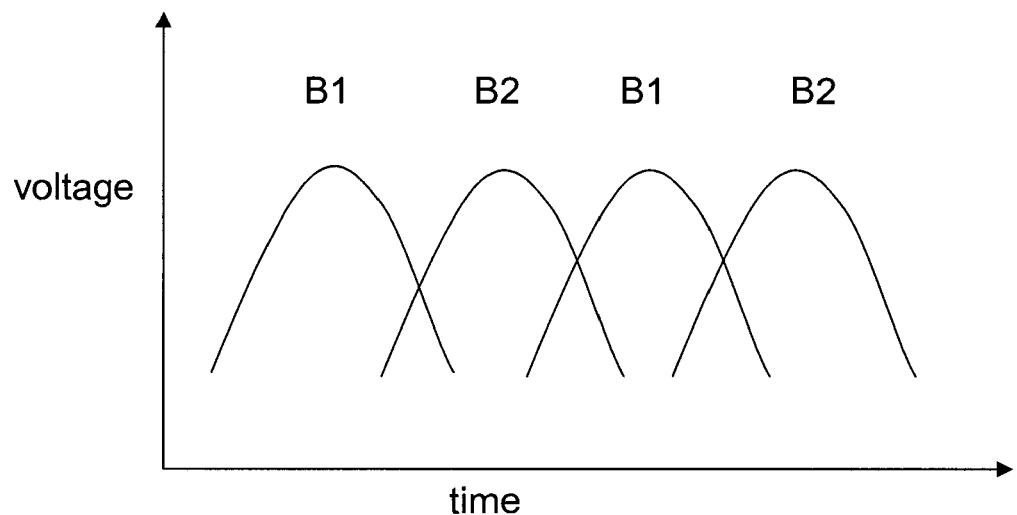
FIG. 5B illustrates example voltage drive pulses for redundant blue OLED devices.

In one example, as illustrated in FIG. 5B, the blue OLED devices referenced as numbers 1 and 2 may be alternately driven by a voltage pulse over time. Thus, each of the blue OLED devices is activated only half of the time as compared with the red or green OLED devices which would be running continuously. Accordingly, the effective lifetime of the system is maintained despite the different expected lifetimes of the components if operating continuously.

In some embodiments, the wearing of individual OLED devices is measured by a sensor. The sensor may be, for example, a local sensor for sensing a junction temperature or a current across the junction. Alternatively, the sensor may be a remote sensor for sensing the light output. The sensor provides means to detect those OLED devices having more wear, and a feedback mechanism to compensate for the uneven wearing/aging. For example, an OLED device with more wearing, as indicated by either a measured parameter such as the current or the light output, or by the total time/cycles that the OLED device has been active, will be controlled to be activated at lower levels as compared with those OLEDs having less wearing.

In another embodiment, a feedback mechanism is included for driving the individual OLED devices to compensate for aging rather than for wear leveling. For example, individual OLED devices may be monitored for their current, output, junction temperature, or other properties, which are fed back into a control circuit to adjust the control voltage or current. For example, when it is detected that an OLED device has a lower drive current than normal, which likely results in lower light output, the drive voltage on that OLED device may be increased. If one of the OLED devices becomes defective and no longer produces light, a backup or redundant OLED device may be activated to replace the "dead" OLED device.

Reverse Bias Healing

Figure 5C:
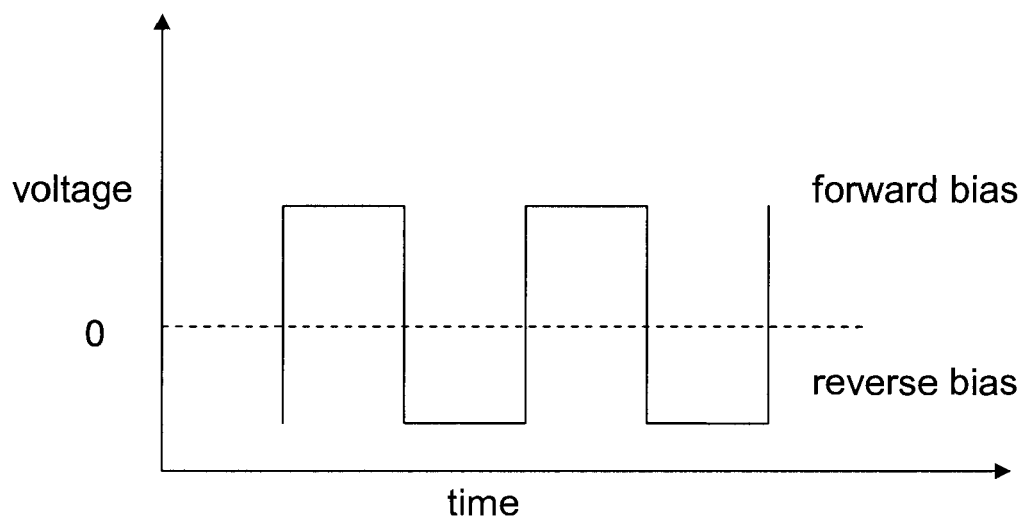
FIG. 5C illustrates example voltage drive pulses including reverse biases for healing OLED devices.

As illustrated in FIG. 5C, the individual OLED devices may be driven by pulsed voltages, and the duty cycles include forward biases where the devices are operated normally, and reverse biases where the devices may be "healed" with defects being repaired by a reverse current.

Address Swapping

Figure 5D:
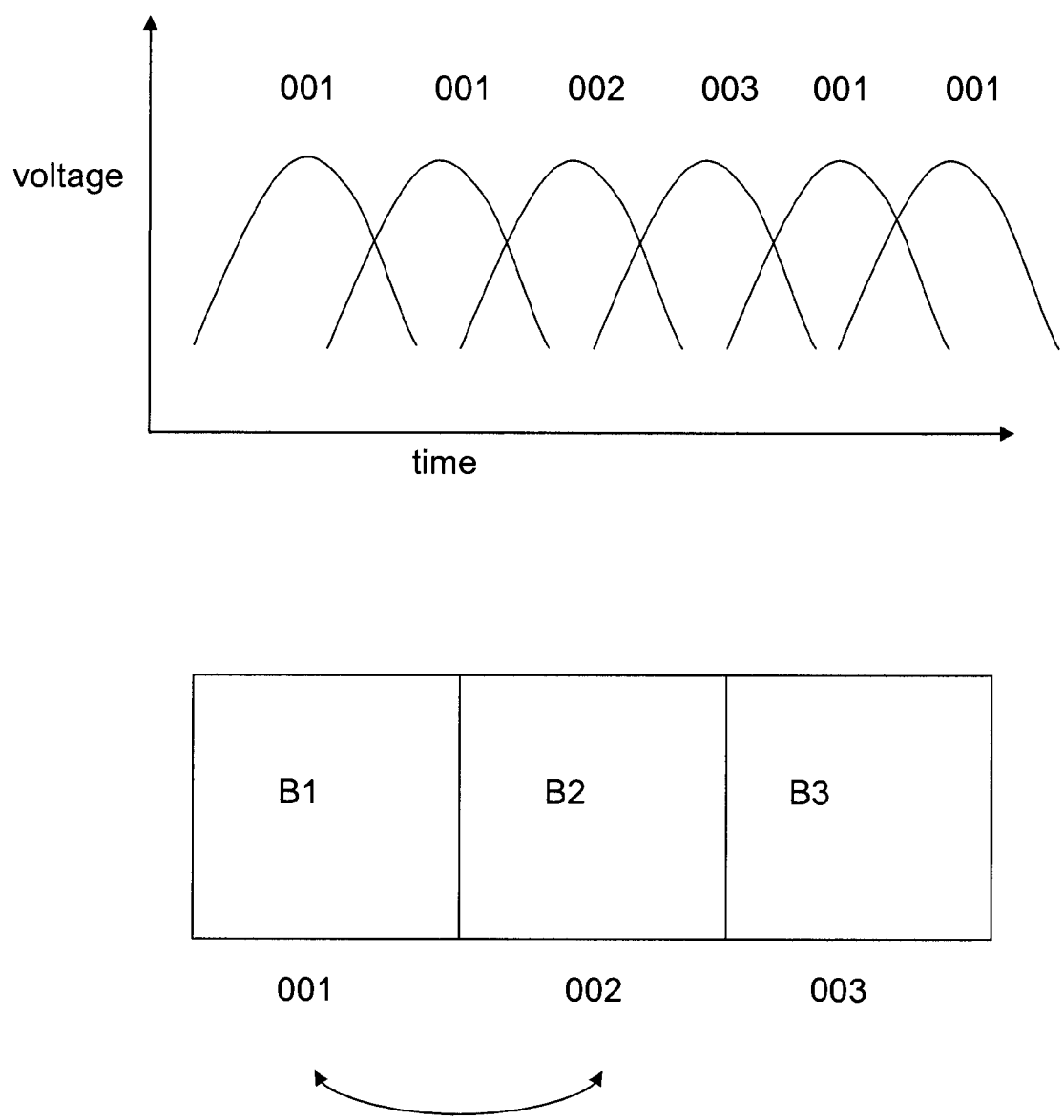
FIG. 5D is a schematic diagram illustrating address swapping among OLED devices for wear leveling.

In one embodiment, a wear leveling mechanism is provided to selectively activate, or to selectively control the activation levels of individual OLEDs, based on the wearing of the OLED devices. This may be achieved, for example, by swapping addresses of the OLED devices in control circuit memory. In one example, as illustrated in FIG. 5D, for the same type of OLED devices B1, B2, and B3 with corresponding addresses of 001, 002, and 003, a drive sequence may be 001/001/002/003 to realize a desired color and/or brightness characteristics. Accordingly, the OLED device B1 wears more than B2 and B3. The controller determines that B1 has been previously activated more often and thus is expected to have a shorter lifetime than that of B2 and B3. Accordingly, the addresses of B1 and B2, or those of B1 and B3, may be swapped. That is, the addresses of B1, B2, B3 are now 002, 001, and 003, respectively. The same drive sequence 001/001/002/003 now drives B2 more often. After a time period, the addresses between B2 and B3 can be swapped so that the same drive sequence drives B3 more often, thereby leveling the wearing of the OLED devices B1, B2, and B3. Thus, the effective lifetime of the system is expanded.

Emission Spectrum

Figure 6:
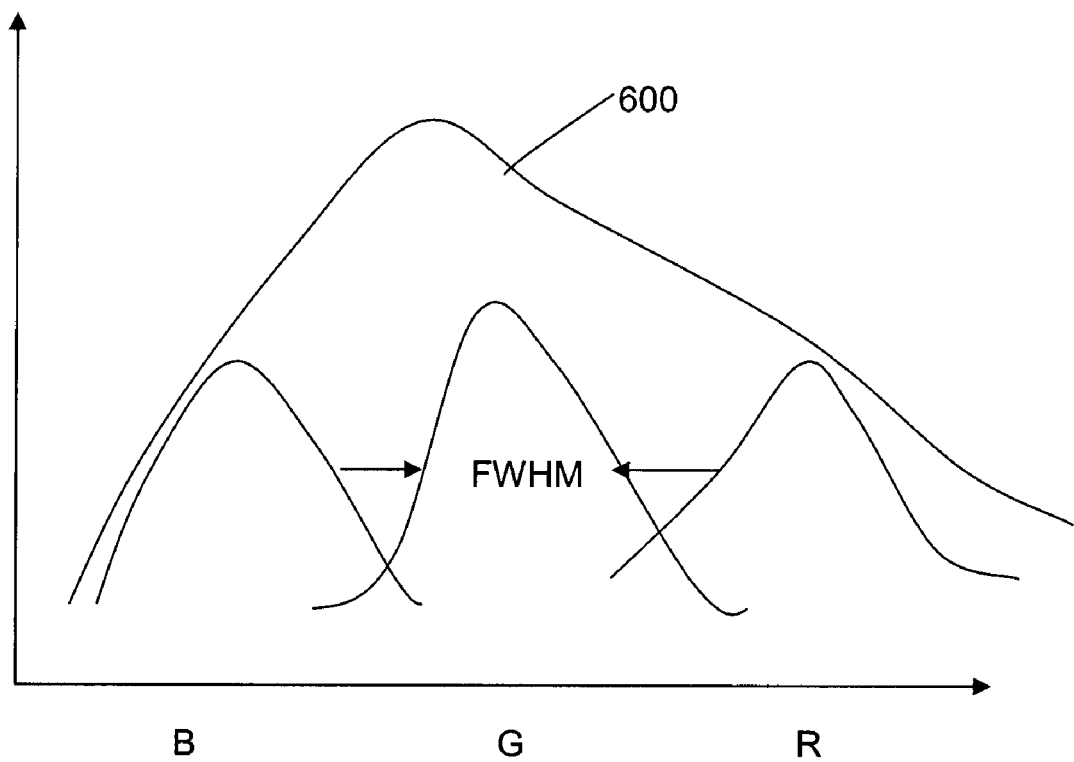
FIG. 6 illustrates example emission spectra of individual OLED devices and the mixed output spectrum.

The active region of the OLED device emits a relatively broad band spectrum. For example, as illustrated in FIG. 6, individual OLED devices may be configured to emit in the blue (B), green (G), red (R), white (W), or the like, regime.

The FWHM of the individual spectrum may be larger than 50 nm. Preferably the FWHM is larger than about 100 nm, and may be even larger than about 200 nm in some cases. The broadband emission spectrum may have a color selected from a white, a red, a green, a blue, a yellow, a orange, a cyan, or a magenta color. By appropriately mixing different OLED devices, the output spectrum 600 can be visually substantially white.

The broadband emission spectrum 600 corresponds to a color rendering index (CRI) higher than about 60, and preferably higher than about 80, or even higher than about 90. In one embodiment, the broadband emission spectrum corresponds to a CRI of about 100.

Advantageously, the broadband spectra of individual OLED devices are mixed to form the output spectrum 600 which may be very close to naturally white light to human eyes. This is in contrast to conventional lighting systems comprising inorganic LED devices, the spectra of which have a relatively narrow band, e.g., on the order of about 10 nm to 40 nm. The resulting mixed light may not be naturally white even when the CRI is high.

The active region of the OLED device may be substantially transparent. The anode may comprise a transparent conductor, for example, indium tin oxide (ITO). The cathode may comprise one of a metal or a metal alloy, such as aluminum-copper, or an organo-metallic material. In some embodiments, the cathode may also comprise a transparent conductor. When mostly transparent layers are used, a plurality of OLED devices may be vertically stacked without blocking light emission from individual devices. In addition, an OLED device may include a plurality of vertically-stacked transparent OLED chips, which are not stand-alone devices as they may not have their own encapsulations, but may have their own substrates and electrodes and can be individually controlled.

OLED Kit

The OLED structure illustrated in FIG. 1, as well as other basic OLED structures, can be applied to a modular design of OLED devices for lighting. In particular, a plurality of pre-manufactured modular OLED devices may be provided, and the individual modular OLED devices can be selected and "plugged" into a mount, thereby forming a configurable lighting system. The system can have desired optical properties, such as the color, by selecting an appropriate set of OLED devices to couple to the mount.

The pre-manufactured OLED devices such as that illustrated in FIG. 1 can be provided in a kit. The kit can include at least two types of pre-manufactured, modular, replaceable, OLED devices of different colors, each OLED device comprising a substrate, an anode, a cathode, and an active region comprising an organic material.

In addition to different colors, OLED devices with different sizes and different shapes may be provided. The active region may have a direct emission area that is very large, e.g., on the order of one meter or larger. The size may be limited by manufacturing processes. Preferably, the active region has a lateral dimension larger than about 0.5 centimeter. The active region preferably has an area larger than 25 mm². Various OLED shapes may include circular or polygonal shapes.

The OLED devices may already have couplers attached thereto, and thus are "plug and play" devices.

Although in FIG. 1 it is shown that the couplers are shown pre-linked to the OLED devices or to the mount, as illustrated in FIGS. 9A-9D, the couplers can be provided as standalone components of the kit. At least one of the plurality of couplers has at least one conductive surface area and at least one insulating surface area at predetermined locations for electrically coupling one of the OLED devices with another OLED device, or with the mount.

The kit may further comprise a homogenizer to reduce the pixilated appearance of an OLED array.

The kit may further comprise a power supply, a mount for receiving at least some of the plurality of OLED devices, and a set of instructions for assembling a subset of the components selected from the kit. Also, the kit can comprise a controller configured to drive the OLED devices, including a controller configured to selectively drive at least some of the plurality of OLED devices at different activation levels.

OLED Devices Having Different Sizes

The processing technologies, such as ink-jet printing, screen printing, Micro Gravure™, etc., allow the solution processable components of an OLED to be fabricated on well-defined and optionally patterned areas. Spin coating, slot-die coating, gravure coating, doctor blading, and the like allow for application of the solution processable components of an OLED to be applied to large area substrates. In addition, the OLED devices can be fabricated with active regions of different sizes. Thus, instead of different numbers of different types of OLED devices of similar sizes, a lighting system with OLED devices of different sizes can be assembled.

For example, a plurality of OLED devices can be provided including a first type of OLED devices each having a first size, and a second type of OLED devices each having a second size. The lifetime of an OLED device depends not only on the emission spectrum as discussed above, but also on the current density flowing through the active region of the OLED device. That is, for a lower current density, there are fewer photoemissions per unit area in the active region, and the lifetime of the OLED device may be longer than a similar device operated at higher current density.

Accordingly, a lighting system can be configured to have different types of OLED devices with different sizes, thereby increasing the effective lifetime of the lighting system. If the first type of OLED devices have a first expected lifetime, and the second type of OLED devices have a second expected lifetime, the lighting system can be constructed with the first type of OLED devices each having a first size, and with the second type of OLED devices each having a second size. A ratio of the first size to the second size can be configured approximately proportional to a ratio of the second expected lifetime to the first expected lifetime. The first type of OLED devices can then be driven at a first current density, and the second type of OLED devices can be driven at a second current density. A ratio of the first current density to the second current density can be configured approximately proportional to a ratio of the second size to the first size. In one embodiment, the ratio of the first current density to the second current density approximately equals a ratio of the second size to the first size.

Figure 7:
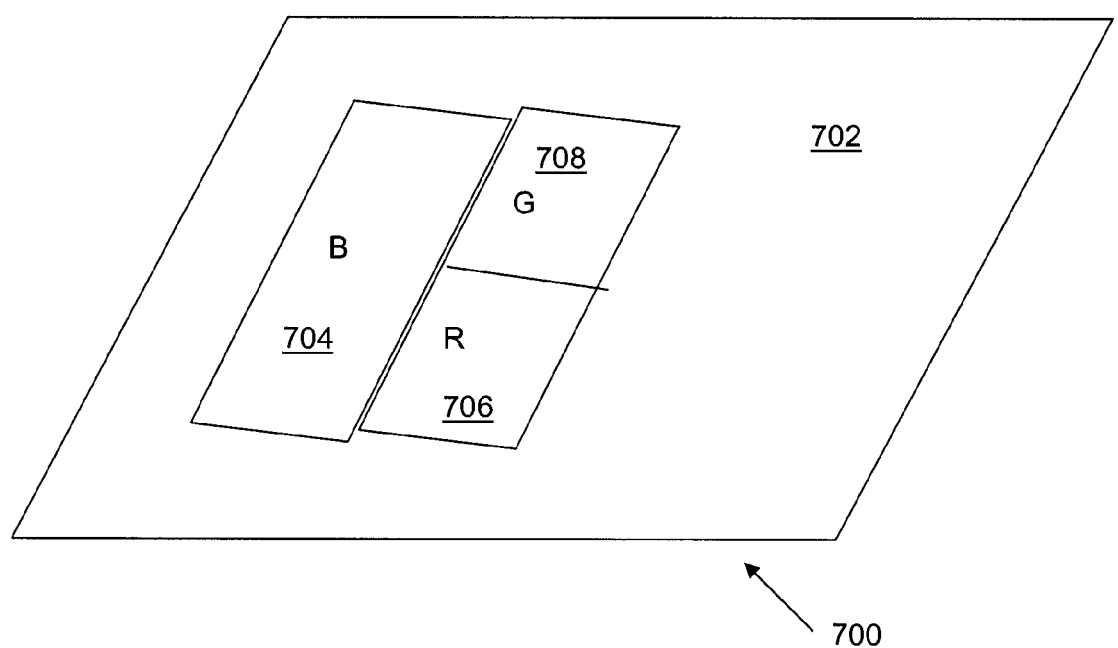
FIG. 7 is a schematic diagram illustrating an example lighting system including OLED devices of different sizes.

In one example system 700 shown in FIG. 7, the plurality of OLED devices coupled to the mount 702 include blue OLED devices 704, red OLED devices 706, and green OLED devices 708. Each of the blue OLED devices 704 has an active region of a size about twice the size of the active region of the red OLED device 706 or the green OLED device 708. In one example, the active region of the blue OLED device 704 has a dimension of about 1 cm×2 cm, while the red OLED device 706 and the green OLED device each has an active region of about 1 cm×1 cm. The blue OLED devices 704 can thus be driven at about the half current density of that of the red OLED device 706, thereby effectively increasing the lifetime of the blue OLED devices. As such, the expected lifetime of the system 700 is improved by choosing the sizes, and/or current densities or other parameters, of the individual devices to have substantially matching lifetimes.

OLED Device Assembled from the Kit

A customer, such as a consumer electronics manufacturer or a consumer, may select a subset of OLED devices from the kit, and assemble a lighting or signage apparatus with appropriate selection of OLED devices having different colors and brightness.

Figure 8:
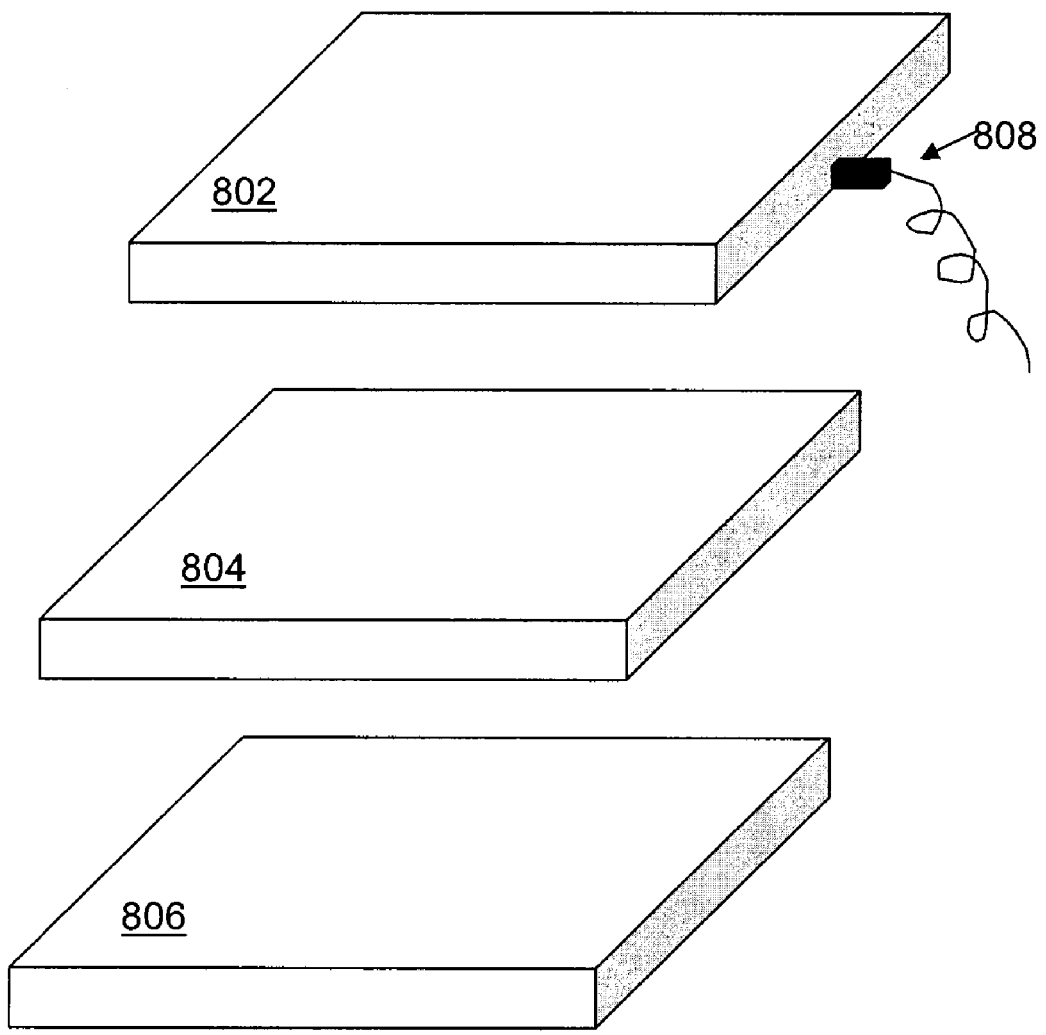
FIG. 8 is an exploded view of a stacked OLED device assembled from a kit of pre-manufactured, modular OLED devices.

For example, in FIG. 8, a stacked OLED configuration is shown, where a plurality of OLED devices 802, 804, 806 are stacked vertically. Electrodes 808 which connect to the OLED device anode and cathode may be arranged on the side, and the individual OLED devices may have transparent substrates such as glass. The stacked OLED structure increases the total light output per unit area, while the individual OLED devices may be driven at a relatively low current, thereby increasing their lifetime.

Alternative to using semi-transparent substrates, anodes, and cathodes, light may be coupled out from the edges of the stack, for example, using gratings and waveguides.

Vertical Coupling of Stacked OLED Devices

Figure 9A:
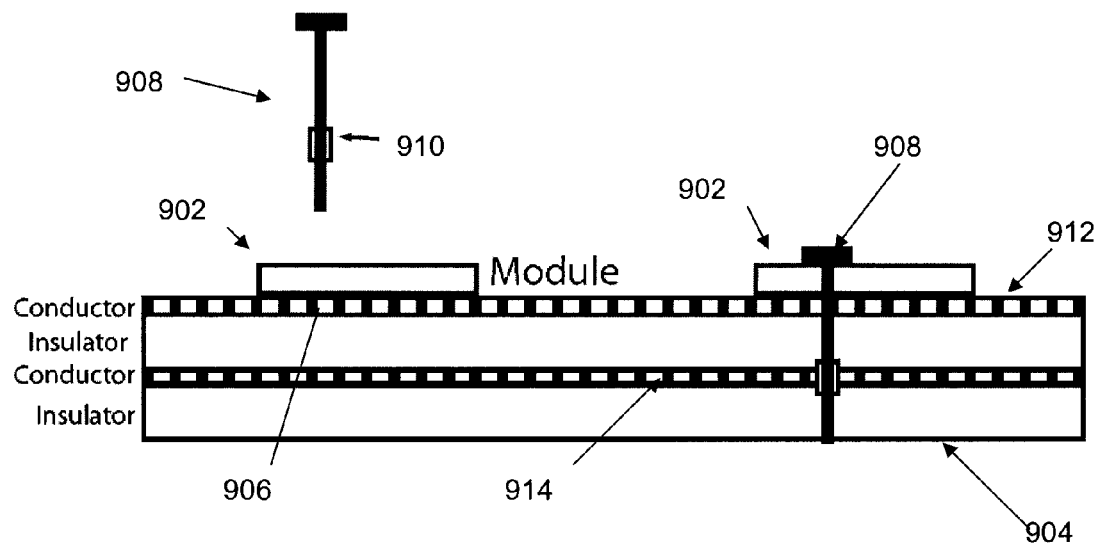
FIGS. 9A-9C are cross-sectional views of example elongated conductors used for coupling OLED devices to form an OLED lighting system.

A method of coupling an OLED device vertically with another OLED device, or with a mount to form a lighting system, is illustrated in FIG. 9A. The OLED device 902 and the mount 904 can have pre-fabricated openings 906, in which elongated conductors 908 may be fit in. The openings 906 may be etched or machined, depending on the substrate material of the OLED device 902 or the mount 904. Alternatively, openings 906 can be pierced by couplers 908 during the assembling process.

The elongated conductors 908 have patterned outer surface areas with insulating regions 910 and conductive regions at desired locations such that, when fitted into the openings 906, proper electrical paths and insulations among the vertical layers may be formed. The elongated conductors 908 may be snuggly fit into the openings 906, or by threaded engaging. The elongated conductor 908 may be flexible to accommodate a flexible system. The elongated conductor is configured to both mechanically and electrically couple one of the OLED devices 902 with another one of the OLED devices or with the mount 904.

In the mount 904 shown in FIG. 9A, two conductive layers 912 and 914 are included. When the elongated conductor 908 is coupled to the mount 904 and the OLED device 902, the insulating region 910 comes into contact with the second conductive layer 914. Accordingly, an electrical connection is established between the first conductive layer 912 and the OLED device 902 through the elongated conductor 908. By prearranging the locations of the insulating regions and the conductive layers, complex electrical connections may be established.

Figure 9B:
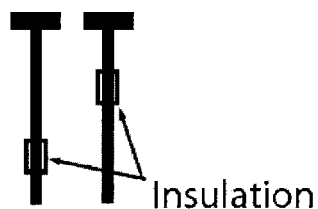
Figure 9B:
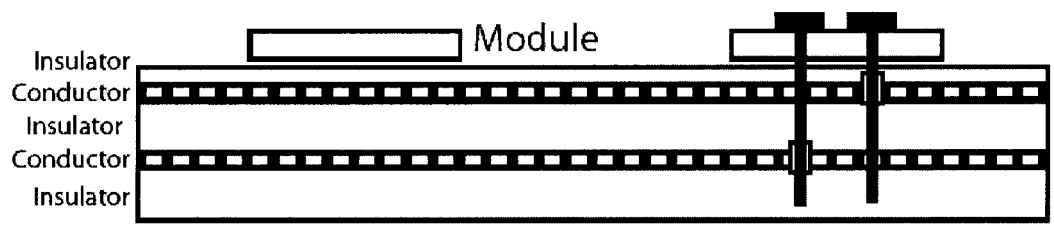

In another example shown in FIG. 9B, two elongated conductors are included each having insulating regions located at different locations. These locations may correspond to the depth of the two conductive layers. As shown, once both elongated conductors are coupled to the OLED device and the mount, two electrodes of the OLED device may be coupled to the first and second conductive layers, respectively.

Figure 9C:
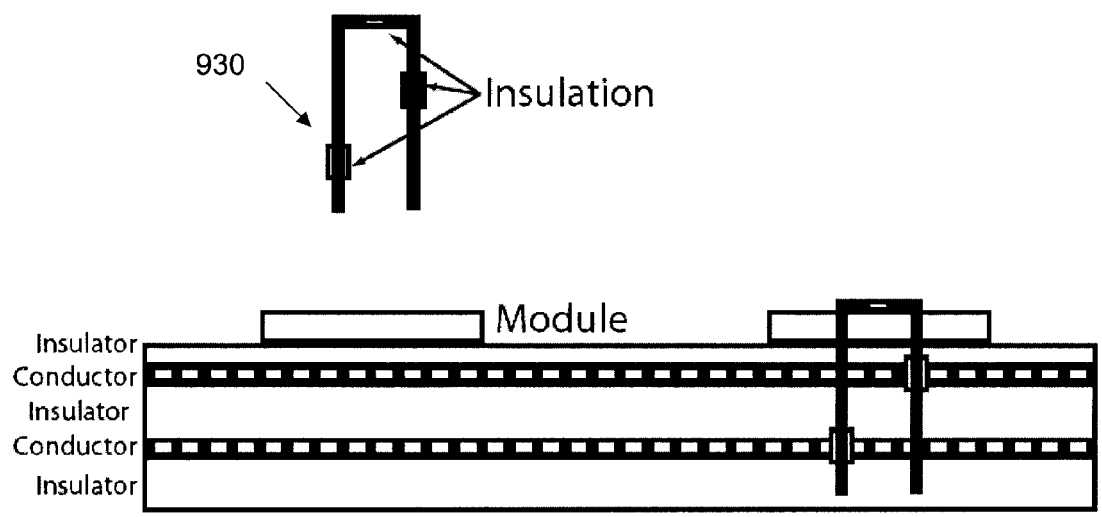

Further, in an embodiment shown in FIG. 9C, an integrated connector 930 may be used. The integrated connector 930 has a substantially "U" shape with two "arms" and resembles a staple. Insulating regions are disposed at different locations of the integrated connector 930. Those of ordinary skill in the art will recognize that connectors of other shapes with more "arms" are possible.

Figure 9D:
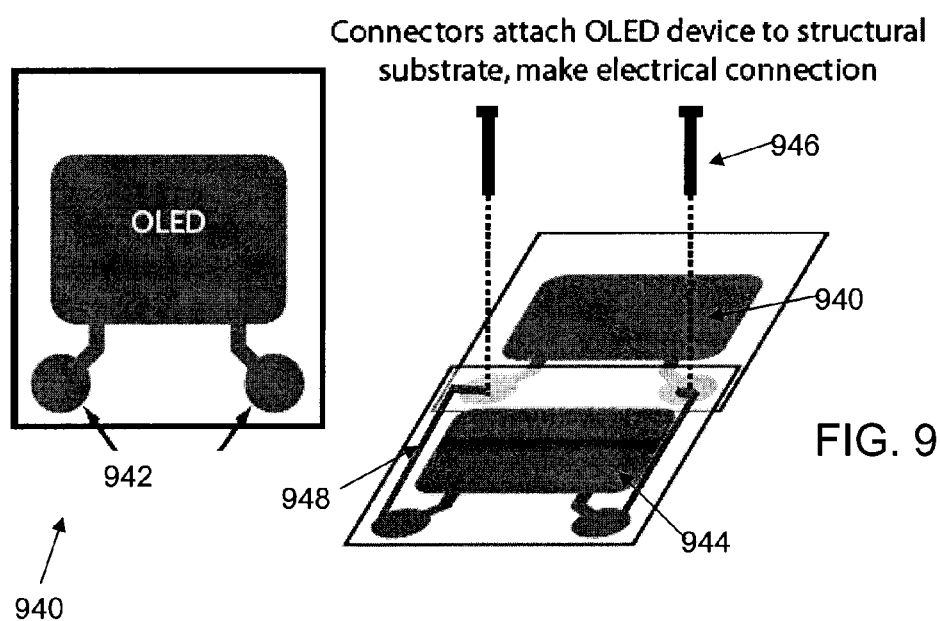
FIG. 9D is a schematic diagram illustrating OLED devices being coupled using elongated conductors.

As shown in FIG. 9D, an example OLED device 940 has one or more contact pads 942. The OLED device 940 can be coupled to a mount, or to another OLED device 944, using elongated conductors 946 that may be "stapled" through the contact pads 942. In one embodiment, a nail gun (not shown) can be used to drive he elongated conductors 946 to pierce through the contact pads 942 or the OLED device 940. As shown, the elongated conductors 946 can be electrically coupled to both OLED devices 940, 944 through their respective contact pads and the electrical paths 948. The electrical paths 948 can be printed on the OLED devices, or fabricated together with the electrodes and the active layers.

The modular OLED devices, which can be pre-manufactured and may be already packaged, may be "plugged in" to a mount and arranged in a pattern. Advantageously as a result of the modular design, the individual OLED devices may be selected from a kit comprising devices with different color characteristics, sizes, and shapes.

In one embodiment, the modular OLED devices are selected and disposed on the mount in a ratio based on their expected lifetime. For example, a two-to-one ratio between the number of blue OLEDs and the number of red OLEDs may be predetermined based on that the lifetime of the blue OLED is about half that of the red OLED.

In one example, more blue OLED devices, which typically have shorter lifetimes, are included in the lighting system, as compared with red or green OLED devices. For example, for every red or green OLED, two (2) blue OLED devices may be included. The two blue OLED devices may be alternately activated as controlled by a controller.

In a "low cost" approach, all the OLED devices may be simply driven by a same voltage and the blue OLEDs may be configured to have higher resistance and thus lower current. This also would improve the lifetime of the blue OLED devices, while the increased number of these blue OLED devices compensates for the lower activation levels to realize the desired luminance and color characteristics.

During the wearing/aging of the lighting system, the color and other optical characteristics are thus effectively controlled by the selection of the OLED devices.

As discussed above with respect to planar lighting systems, the vertically-stacked OLED devices can also be individually controlled by a controller to achieve color tuning, aging compensation, and wear leveling.

Further Embodiments

Priority provisional application Ser. No. 61/102,326 filed Oct. 2, 2008 is incorporated by reference including the following embodiments:

In one embodiment, a lighting system is provided. The lighting system has a plurality of OLED devices and a controller configured to independently control activation levels of at least some of the plurality of OLED devices based on their expected lifetime to increase a lifetime of the lighting system.

In another embodiment, a lighting system is provided. The lighting system has a plurality of OLED devices and a controller configured to independently control activation levels of at least some of the plurality of OLED devices based on their expected lifetime to increase a lifetime of the lighting system. The activation levels are characterized by at least one of a drive voltage level, a drive current level, a pulse width, a pulse frequency, an on state, or an off state.

In another embodiment, a lighting system is provided. The lighting system has a plurality of OLED devices and a controller configured to independently control activation levels of at least some of the plurality of OLED devices based on their expected lifetime to increase a lifetime of the lighting system. The plurality of OLED devices include a first number of a first type of OLED devices and a second number of second type of OLED devices. The first type of OLED devices have color characteristics different from the second type of OLED devices.

In another embodiment, a lighting system is provided. The lighting system has a plurality of OLED devices and a controller configured to independently control activation levels of at least some of the plurality of OLED devices based on their expected lifetime to increase a lifetime of the lighting system. The plurality of OLED devices include a first number of a first type of OLED devices and a second number of second type of OLED devices, and the first type of OLED devices have color characteristics different from the second type of OLED devices. Furthermore, the first type of OLED devices have an expected lifetime shorter than an expected lifetime of the second type of OLED devices, and the first number is larger than the second number.

In another embodiment, a lighting system is provided. The lighting system has a plurality of OLED devices and a controller configured to independently control activation levels of at least some of the plurality of OLED devices based on their expected lifetime to increase a lifetime of the lighting system. The plurality of OLED devices include a first number of a first type of OLED devices and a second number of second type of OLED devices, and the first type of OLED devices have color characteristics different from the second type of OLED devices. Furthermore, the first type of OLED devices have an expected lifetime shorter than an expected lifetime of the second type of OLED devices, and the first number is correspondingly larger than the second number. The controller is configured to alternately activate at least some of the first type of OLED devices thereby increasing a lifetime of the lighting system.

In another embodiment, a lighting system is provided. The lighting system has a plurality of OLED devices and a controller configured to independently control activation levels of at least some of the plurality of OLED devices based on their expected lifetime to increase a lifetime of the lighting system. The plurality of OLED devices include a first number of blue OLED devices, a second number of red OLED devices, and a third number of green OLED devices. The first number is about twice the second number. The controller is configured to alternately activating neighboring blue OLED devices thereby increasing a lifetime of the lighting system.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are configured to be selectively driven at different activation levels to improve a lifetime of the lighting system based on different wearing levels of the plurality of OLED devices.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are configured to be selectively driven at different activation levels to improve a lifetime of the lighting system based on different wearing levels of the plurality of OLED devices. A wearing level of an OLED device is determined based on one or more of an accumulative duration that the OLED device has been previously activated, a measured current, a capacitance, a junction temperature, or a luminance of the OLED device.

In another embodiment, a lighting system is provided. The lighting system has a plurality of OLED devices and a controller configured to independently control activation levels of at least some of the plurality of OLED devices based on their expected lifetime to increase a lifetime of the lighting system. The controller is configured to selectively drive at least some of the plurality of OLED devices to different activation levels to compensate for degradation of some of the plurality of OLED devices thereby maintaining the desired output color characteristics.

In another embodiment, a lighting system is provided. The lighting system has a plurality of OLED devices and a controller configured to independently control activation levels of at least some of the plurality of OLED devices based on their expected lifetime to increase a lifetime of the lighting system. The lighting system further comprises a sensor for sensing a degradation of one or more of the plurality of OLED devices. The controller is configured to drive the one or more of the plurality of OLED devices to different activation levels to compensate for the sensed degradation.

In another embodiment, a lighting system is provided. The lighting system has a plurality of OLED devices and a controller configured to independently control activation levels of at least some of the plurality of OLED devices based on their expected lifetime to increase a lifetime of the lighting system. The lighting system further comprises a sensor for sensing a degradation of one or more of the plurality of OLED devices. The controller is configured to increase a drive voltage or a drive current of the one or more of the plurality of OLED devices to compensate for the sensed degradation.

In another embodiment, a lighting system is provided. The lighting system has a plurality of OLED devices and a controller configured to independently control activation levels of at least some of the plurality of OLED devices based on their expected lifetime to increase a lifetime of the lighting system. The lighting system further comprises a sensor for sensing a degradation of one or more of the plurality of OLED devices. At least some of the plurality of OLED devices are redundant OLED devices, and the controller is configured to turn on one or more of the redundant OLED devices to compensate for the sensed degradation.

In another embodiment, a lighting system is provided. The lighting system has a plurality of OLED devices and a controller configured to independently control activation levels of at least some of the plurality of OLED devices based on their expected lifetime to increase a lifetime of the lighting system. The lighting system further comprises a sensor for sensing a degradation of one or more of the plurality of OLED devices. The sensor is configured to sense one of a temperature, a current, a capacitance, or a luminance of the one or more of the plurality of OLED devices.

In another embodiment, a lighting system is provided. The lighting system has a plurality of OLED devices and a controller configured to independently control activation levels of at least some of the plurality of OLED devices based on their expected lifetime to increase a lifetime of the lighting system. The controller is further configured to tune a color of light emitted from the lighting system by selectively driving at least some of the plurality of OLED devices at activation levels different from some other of the plurality of OLED devices.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are vertically stacked.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are vertically stacked, and at least one of the vertically stacked OLED devices is substantially transparent in the vertical direction.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are vertically stacked, and at least some of the vertically stacked OLED devices have a transparent glass substrate.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are vertically stacked, and at least one of the vertically stacked OLED devices is configured as an edge-emitting OLED device.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are vertically stacked. The lighting system further comprises an edge emitting coupler for improving light output from an edge of at least one of the vertically stacked OLED devices. The edge emitting coupler comprises at least one of a grating or a waveguide.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are vertically stacked, and at least two of the OLED devices are configured to emit light of different colors.

In another embodiment, a lighting system is provided. The lighting system has a plurality of OLED devices and a controller configured to independently control activation levels of at least some of the plurality of OLED devices based on their expected lifetime to increase a lifetime of the lighting system. At least some of the plurality of OLED devices are vertically stacked, and at least some of the plurality of OLED devices are substantially transparent.

In another aspect, a lighting system is provided. The lighting system has a plurality of OLED devices, wherein each of the plurality of OLED devices has an active region. At least some of the OLED devices have active regions of different sizes, and the different sizes are selected such that light emitted from the lighting system has desired color characteristics and that the OLED devices having active regions of different sizes have substantially matching lifetimes.

In another aspect, a lighting system is provided. The lighting system has a plurality of OLED devices, wherein each of the plurality of OLED devices has an active region. At least some of the OLED devices have active regions of different sizes, and the different sizes are selected such that light emitted from the lighting system has desired color characteristics and that the OLED devices having active regions of different sizes have substantially matching lifetimes. The plurality of OLED devices include a first type of OLED devices each having an active region of a first size and a first expected lifetime, and a second type of OLED devices each having an active region of a second size and a second expected lifetime. A ratio of the first size to the second size is approximately proportional to a ratio of the second expected lifetime to the first expected lifetime, wherein the first type of OLED devices are driven at a first current density, and the second type of OLED devices are driven at a second current density. A ratio of the first current density to the second current density is approximately proportional to a ratio of the second size to the first size thereby substantially matching actual lifetimes of the first type of OLED devices and the second type of OLED devices.

In another aspect, a lighting system is provided. The lighting system has a plurality of OLED devices, wherein each of the plurality of OLED devices has an active region. At least some of the OLED devices have active regions of different sizes, and the different sizes are selected such that light emitted from the lighting system has desired color characteristics and that the OLED devices having active regions of different sizes have substantially matching lifetimes.

The plurality of OLED devices include a first type of OLED devices each having an active region of a first size and a first expected lifetime, and a second type of OLED devices each having an active region of a second size and a second expected lifetime. A ratio of the first size to the second size is approximately equal to a ratio of the second expected lifetime to the first expected lifetime, wherein the first type of OLED devices are driven at a first current density, and the second type of OLED devices are driven at a second current density. A ratio of the first current density to the second current density is approximately equal to a ratio of the second size to the first size thereby substantially matching actual lifetimes of the first type of OLED devices and the second type of OLED devices.

In another aspect, a lighting system is provided. The lighting system has a plurality of OLED devices, wherein each of the plurality of OLED devices has an active region. At least some of the OLED devices have active regions of different sizes, and the different sizes are selected such that light emitted from the lighting system has desired color characteristics and that the OLED devices having active regions of different sizes have substantially matching lifetimes. The plurality of OLED devices include a first plurality of active regions configured to emit substantially red light, a second plurality of active regions configured to emit substantially green light, and a third plurality of active regions configured to emit substantially blue light. At least some of the third plurality of active regions have increased sizes and correspondingly reduced current densities as compared with the first plurality and the second plurality of active regions to increase an actual lifetime of the third plurality of active regions.

In another aspect, a lighting system is provided. The lighting system has a plurality of OLED devices, wherein each of the plurality of OLED devices has an active region. At least some of the OLED devices have active regions of different sizes, and the different sizes are selected such that light emitted from the lighting system has desired color characteristics and that the OLED devices having active regions of different sizes have substantially matching lifetimes. The plurality of OLED devices include a first plurality of red OLED devices, a second plurality of green OLED devices, and a third plurality of blue OLED devices. Each of the third plurality of blue OLED devices has an active region about twice the size of each of the red OLED devices, and each of the third plurality of blue OLED devices is driven at a reduced current density to increase an actual lifetime of the blue OLED devices.

In another aspect, a lighting system is provided. The lighting system has a plurality of OLED devices, wherein each of the plurality of OLED devices has an active region. At least some of the OLED devices have active regions of different sizes, and the different sizes are selected such that light emitted from the lighting system has desired color characteristics and that the OLED devices having active regions of different sizes have substantially matching lifetimes. At least one of the plurality of OLED device has at least one coupler configured to electrically couple the OLED device to a power supply and an encapsulation that isolates the OLED device from an ambient environment.

In another aspect, a lighting system is provided. The lighting system has a plurality of OLED devices, wherein each of the plurality of OLED devices has an active region. At least some of the OLED devices have active regions of different sizes, and the different sizes are selected such that light emitted from the lighting system has desired color characteristics and that the OLED devices having active regions of different sizes have substantially matching lifetimes. At least some of the plurality of OLED devices are vertically stacked, and at least two of the OLED devices are configured to emit light of different colors.

In another embodiment, a method is provided. The method comprises selectively controlling activation levels of at least some of a plurality of OLED devices based on their expected lifetime to improve a lifetime of the lighting system.

In another embodiment, a method is provided. The method comprises selectively controlling activation levels of at least some of a plurality of OLED devices based on their expected lifetime to improve a lifetime of the lighting system. The method further comprises determining wearing levels of the at least some of the plurality of OLED devices. In this embodiment the selectively controlling activation levels of at least some of the plurality of OLED devices comprises selectively controlling the at least some of the plurality of OLED devices based on the determined wearing levels the OLED devices, wherein a wearing level of an OLED device is determined based on one or more of an accumulative duration that the OLED device has been previously activated, a measured current, a capacitance, a junction temperature, or a luminance of the OLED device.

In another embodiment, a method is provided. The method comprises selectively controlling activation levels of at least some of a plurality of OLED devices based on their expected lifetime to improve a lifetime of the lighting system. The method further comprises assigning addresses to the at least some of the plurality of OLED devices and swapping addresses between at least a first OLED device and a second OLED device among the at least some of the plurality of OLED devices. The first and second OLED devices have different wearing levels. A wearing level of an OLED device is determined based on one or more of an accumulative duration that the OLED device has been previously activated, a measured current, a capacitance, a junction temperature, or a luminance of the OLED device.

In another embodiment, a method is provided. The method comprises selectively controlling activation levels of at least some of a plurality of OLED devices based on their expected lifetime to improve a lifetime of the lighting system.

The plurality of OLED devices include a first type of OLED devices. The method further comprises alternately activating some of the first type of OLED devices thereby improving a lifetime of the lighting system.

In another embodiment, a method is provided. The method comprises selectively controlling activation levels of at least some of a plurality of OLED devices based on their expected lifetime to improve a lifetime of the lighting system. The plurality of OLED devices include a first number of blue OLED devices, a second number of red OLED devices, and a third number of green OLED devices. The first number is about twice the second number. The method further comprises alternately activating neighboring blue OLED devices thereby increasing a lifetime of the lighting system.

In another aspect, a lighting system is provided. The lighting system has a plurality of OLED devices and a controller configured to selectively drive the plurality of OLED devices to different activation levels such that an output light from the lighting system has a desired color characteristics. At least one of the plurality of OLED devices has at least one coupler configured to electrically couple the OLED device to a power supply and an encapsulation that isolates the OLED device from an ambient environment.

In another aspect, a lighting system is provided. The lighting system has a plurality of OLED devices and a controller configured to selectively drive the plurality of OLED devices to different activation levels such that an output light from the lighting system has a desired color characteristics. At least one of the plurality of OLED devices has at least one coupler configured to electrically couple the OLED device to a power supply and an encapsulation that isolates the OLED device from an ambient environment. The activation levels are characterized by at least one of a drive voltage level, a drive current level, a drive pulse width, a drive pulse frequency, an on state, or an off state.

In another aspect, a lighting system is provided. The lighting system has a plurality of OLED devices and a controller configured to selectively drive the plurality of OLED devices to different activation levels such that an output light from the lighting system has a desired color characteristics. At least one of the plurality of OLED devices has at least one coupler configured to electrically couple the OLED device to a power supply and an encapsulation that isolates the OLED device from an ambient environment. A color of light emitted from the lighting system is tunable by selectively varying activation levels of at least some of the plurality of OLED devices.

In another aspect, a lighting system is provided. The lighting system has a plurality of OLED devices and a controller configured to selectively drive the plurality of OLED devices to different activation levels such that an output light from the lighting system has a desired color characteristics. At least one of the plurality of OLED devices has at least one coupler configured to electrically couple the OLED device to a power supply and an encapsulation that isolates the OLED device from an ambient environment. A color of light emitted from the lighting system is tunable by selectively varying at least one of a drive voltage or a drive current of at least some of the plurality of OLED devices.

In another aspect, a lighting system is provided. The lighting system has a plurality of OLED devices and a controller configured to selectively drive the plurality of OLED devices to different activation levels such that an output light from the lighting system has a desired color characteristics. At least one of the plurality of OLED devices has at least one coupler configured to electrically couple the OLED device to a power supply and an encapsulation that isolates the OLED device from an ambient environment. The controller is configured to selectively drive at least some of the plurality of OLED devices to different activation levels to compensate for degradation of some of the plurality of OLED devices thereby maintaining the desired output color characteristics.

In another aspect, a lighting system is provided. The lighting system has a plurality of OLED devices and a controller configured to selectively drive the plurality of OLED devices to different activation levels such that an output light from the lighting system has a desired color characteristics. At least one of the plurality of OLED devices has at least one coupler configured to electrically couple the OLED device to a power supply and an encapsulation that isolates the OLED device from an ambient environment. The lighting system further comprises a sensor for sensing a degradation of one or more of the plurality of OLED devices, wherein the controller is configured to drive one or more of the plurality of OLED devices to different activation levels to compensate for the sensed degradation.

In another aspect, a lighting system is provided. The lighting system has a plurality of OLED devices and a controller configured to selectively drive the plurality of OLED devices to different activation levels such that an output light from the lighting system has a desired color characteristics. At least one of the plurality of OLED devices has at least one coupler configured to electrically couple the OLED device to a power supply and an encapsulation that isolates the OLED device from an ambient environment. The lighting system further comprises a sensor for sensing a degradation of one or more of the OLED devices. The controller is configured to increase a drive voltage or a drive current of one or more of the OLED devices to compensate for the sensed degradation.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. The lighting system further comprises a sensor for sensing a degradation of one or more of the OLED devices. At least some of the OLED devices are redundant OLED devices, and the controller is configured to turn on one or more of the redundant OLED devices to compensate for the sensed degradation.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. The lighting system further comprises a sensor for sensing a degradation of one or more of the OLED devices. The sensor is configured to sense one of a temperature, a current, a capacitance, or a luminance of one or more OLED devices.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. The controller is configured to drive at least some of the OLED devices to different activation levels to expand a lifetime of the lighting system.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. The controller is configured to selectively turn on or off at least some of the OLED devices based on an expected lifetime of the OLED devices.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. The controller is configured to selectively drive at least some of the OLED devices to different activation levels to expand a lifetime of the lighting system. The different activation levels include different drive pulse widths.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. The plurality of OLED devices include a first number of a first type of OLED devices and a second number of a second type of OLED devices, and the first type of OLED devices have a light emission spectrum different from a light emission spectrum of the second type of OLED devices.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. The plurality of OLED devices include a first number of a first type of OLED devices and a second number of a second type of OLED devices, and the first type of OLED devices have a light emission spectrum different from a light emission spectrum of the second type of OLED devices. Furthermore, the first type of OLED devices have an expected lifetime shorter than the second type of OLED devices, and the first number is correspondingly larger than the second number.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. The plurality of OLED devices include a first number of a first type of OLED devices and a second number of a second type of OLED devices, and the first type of OLED devices have a spectrum different from a spectrum of the second type of OLED devices. Furthermore, the first type of OLED devices have a lifetime shorter than the second type of OLED devices, and the first number is correspondingly larger than the second number. The controller is configured to selectively drive the first type of OLED devices to different activation levels such that not all of the first type of OLED devices are turned on at the same time thereby increasing the lifetime of the first type of OLED devices.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. At least some of the plurality of OLED devices are vertically stacked.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. At least some of the plurality of OLED devices are vertically stacked, and at least some of the vertically stacked OLED devices have a transparent substrate.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. At least some of the plurality of OLED devices are vertically stacked, and at least some of the vertically stacked OLED devices have a transparent glass substrate.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. At least some of the plurality of OLED devices are vertically stacked, and are configured as edge-emitting OLED devices.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. At least some of the plurality of OLED devices are vertically stacked. The lighting system further comprises an edge emitting coupler for improving light output from an edge of the vertically stacked OLED devices. The edge emitting coupler comprises at least one of a grating or a waveguide.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. At least some of the plurality of OLED devices are vertically stacked, and at least two of the OLED devices are configured to emit light of different colors.

In another aspect, a lighting system is provided. The lighting system has a plurality of OLED devices and a controller configured to selectively drive the OLED devices to different activation levels such that an output light from the lighting system has a desired color characteristics. At least one of the OLED devices has at least one coupler configured to electrically couple the OLED device to a power supply and an encapsulation that isolates the OLED device from an ambient environment. At least some of the plurality of OLED devices are vertically stacked, and at least one of the plurality of OLED devices is substantially transparent.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. At least some of the OLED devices emit light of different spectra, and the spectra have colors selected from red, green, blue, cyan, magenta, or white.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. The coupler is removable from the OLED device.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. In this embodiment, a color of light emitted from the lighting system is changeable by selectively replacing at least a subset of OLED devices.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. The plurality of OLED devices include a first number of a first type of OLED devices and a second number of a second type of OLED devices, and the first type of OLED devices have a spectrum different from a spectrum of the second type of OLED devices.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. The plurality of OLED devices include a first number of a first type of OLED devices and a second number of a second type of OLED devices, and the first type of OLED devices have a spectrum different from a spectrum of the second type of OLED devices. Furthermore, the first number is larger than the second number, and at least some of the first type of OLED devices are driven at a reduced activation level to increase an average lifetime of the first type of OLED devices to be comparable with a lifetime of the second type of OLED devices.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. The plurality of OLED devices include a first number of a first type of OLED devices and a second number of a second type of OLED devices, and the first type of OLED devices have a spectrum different from a spectrum of the second type of OLED devices. Furthermore, the first type of OLED devices have an expected lifetime shorter than an expected lifetime of the second type of OLED devices, and the first number is correspondingly larger than the second number. The controller is configured to selectively activate the first type of OLED devices such that not all of the first type of OLED devices are activated at the same time thereby substantially matching lifetimes of the first type of OLED devices and the second type of OLED devices while maintaining color coordinates.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. At least some of the plurality of OLED devices are vertically stacked.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. At least some of the plurality of OLED devices are vertically stacked, and at least one of the plurality of OLED devices is substantially transparent.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. At least some of the plurality of OLED devices are vertically stacked, and at least one of the plurality of OLED devices is configured as an edge-emitting OLED device.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. At least some of the plurality of OLED devices are vertically stacked. The system further comprises an edge emitting coupler for improving light output from an edge of the vertically stacked OLED devices. The edge emitting coupler comprises at least one of a grating or a waveguide.

In another embodiment, a lighting system is provided. The lighting system has a mount and a plurality of OLED devices removably coupled to the mount. The plurality of OLED devices are selected such that the lighting system emits light with desired color characteristics. At least one of the plurality of OLED devices has a coupler configured to electrically couple the OLED device to a power supply and an encapsulation that isolates the OLED device from an ambient environment. At least some of the plurality of OLED devices are vertically stacked, and at least two of the OLED devices are configured to emit light of different colors.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. Selecting the subset of OLED devices comprises selecting a first number of a first type of OLED devices and a second number of a second type of OLED devices. In this aspect, the first type of OLED devices have a first spectrum different from a second spectrum of the second type of OLED devices.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. Selecting the subset of OLED devices comprises selecting a first number of a first type of OLED devices and a second number of a second type of OLED devices. In this aspect the first type of OLED devices have a first spectrum different from a second spectrum of the second type of OLED devices. Thee first type of OLED devices have an expected lifetime substantially shorter than an expected lifetime the second type of OLED devices, and selecting the subset of OLED devices comprises selecting the first number substantially larger than the second number.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. Selecting the subset of OLED devices comprises selecting a first number of a first type of OLED devices and a second number of a second type of OLED devices. In this aspect, the first type of OLED devices have a first spectrum different from a second spectrum of the second type of OLED devices, and the first type of OLED devices have an expected lifetime substantially shorter than an expected lifetime of the second type of OLED devices. Selecting the subset of OLED devices comprises selecting the first number substantially larger than the second number. The method further comprises selectively activating the first type of OLED devices such that not all of the first type of OLED devices are activated at the same time thereby increasing the lifetime of the first type of OLED devices.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. Selecting the subset of OLED devices comprises selecting a first number of a first type of OLED devices and a second number of a second type of OLED devices. In this aspect, the first type of OLED devices have a first spectrum different from a second spectrum of the second type of OLED devices, and the first type of OLED devices have an expected lifetime substantially shorter than an expected lifetime of the second type of OLED devices. Selecting the subset of OLED devices comprises selecting the first number substantially larger than the second number. The method further comprises selectively activating the first type of OLED devices such that not all of the first type of OLED devices are activated at the same time thereby increasing an average lifetime of the first type of OLED devices. Selectively activating the first type of OLED devices comprises electrically driving the first type of OLED devices with voltage or current pulses shorter than those of the second type of OLED devices.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. Selecting the subset of OLED devices comprises selecting a first number of a first type of OLED devices and a second number of a second type of OLED devices. In this aspect, the first type of OLED devices have a first spectrum different from a second spectrum of the second type of OLED devices, and the first type of OLED devices have an expected lifetime substantially shorter than an expected lifetime of the second type of OLED devices. Selecting the subset of OLED devices comprises selecting the first number substantially larger than the second number.

The method further comprises selectively activating the first type of OLED devices such that not all of the first type of OLED devices are activated at the same time thereby increasing an average lifetime of the first type of OLED devices. Selectively activating the first type of OLED devices comprises electrically driving the first type of OLED devices with current pulses, wherein electrically driving the first type of OLED devices with current pulses comprises reversely biasing the first type of OLED devices during part of the current pulses to heal the first type of OLED devices.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. The method further comprises selectively driving at least some of the plurality of OLED devices to different activation levels to compensate for degradation of some of the plurality of OLED devices thereby maintaining the desired output color characteristics.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. The method further comprises sensing a degradation of one or more OLED devices and driving one or more of OLED devices at different activation levels to compensate for the sensed degradation.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. The method further comprises sensing a degradation of one or more OLED devices and increasing a drive voltage or a drive current of one or more OLED devices to compensate for the sensed degradation.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. The method further comprises sensing a degradation of one or more of the plurality of OLED devices, wherein at least some of the plurality of OLED devices are redundant OLED devices, and turning on one or more of the redundant OLED devices to compensate for the sensed degradation.

In another aspect, a method is provided. The method comprises selecting, from a kit of pre-manufactured modular OLED devices, a subset of OLED devices and coupling the selected subset of OLED devices to a mount. The subset of OLED devices is selected to have a mixed output light spectrum with desired color characteristics. The method further comprises sensing a degradation of one or more OLED devices by measuring one of a temperature, a current, a capacitance, or a luminance of the OLED devices.

In another embodiment, a lighting system is provided. The lighting system has a mount, a plurality of couplers, and a plurality of OLED devices removably coupled to the mount through the plurality of couplers. The plurality of OLED devices are selected such that the lighting system emits light with a desired color characteristics. At least one of the OLED devices comprises an encapsulation that isolates the OLED device from an ambient environment.

In another embodiment, a lighting system is provided. The lighting system has a mount, a plurality of couplers, and a plurality of OLED devices removably coupled to the mount through the plurality of couplers. The plurality of OLED devices are selected such that the lighting system emits light with a desired color characteristics. At least one of the OLED devices comprises an encapsulation that isolates the OLED device from an ambient environment. In this embodiment, at least one of the plurality of couplers is fixedly coupled with one of the plurality of OLED devices.

In another embodiment, a lighting system is provided. The lighting system has a mount, a plurality of couplers, and a plurality of OLED devices removably coupled to the mount through the plurality of couplers. The plurality of OLED devices are selected such that the lighting system emits light with a desired color characteristics. At least one of the OLED devices comprises an encapsulation that isolates the OLED device from an ambient environment. In this embodiment, at least one of the plurality of couplers is fixedly coupled with the mount.

In another embodiment, a lighting system is provided. The lighting system has a mount, a plurality of couplers, and a plurality of OLED devices removably coupled to the mount through the plurality of couplers. The plurality of OLED devices are selected such that the lighting system emits light with a desired color characteristics. At least one of the OLED devices comprises an encapsulation that isolates the OLED device from an ambient environment. In this embodiment, the couplers are configured to electrically couple the OLED devices to a power supply.

In another aspect, a kit is provided. The kit has a plurality of OLED devices and a plurality of couplers.

In another aspect, a kit is provided. The kit has a plurality of OLED devices and a plurality of couplers. At least one of the plurality of couplers is pre-linked to one of the plurality of OLED devices.

In another aspect, a kit is provided. The kit has a plurality of OLED devices and a plurality of couplers. The kit further comprises a mount for receiving at least some of the OLED devices. At least one of the couplers is pre-linked to the mount.

In another aspect, a kit is provided. The kit has a plurality of OLED devices and a plurality of couplers. The kit further comprises a power supply. The couplers are configured to electrically couple the OLED devices to a power supply.

In another aspect, a kit is provided. The kit has a plurality of OLED devices and a plurality of couplers. The kit further comprises a set of instructions for assembling the OLED devices and couplers.

The embodiments shown in FIGS. 1-9 are exemplary. Other embodiments can be prepared within the spirit and scope of the claims by one skilled in the art.

What is claimed is:

1. A lighting system comprising:
   a plurality of organic light emitting diode (OLED) devices;
   a controller configured to selectively drive at least some of the plurality of OLED devices at different activation levels; and
   a sensor configured to sense a degradation at least one of the plurality of OLED devices,
   wherein at least one of the plurality of OLED devices comprises:
      at least one coupler configured to electrically couple the OLED device to a power supply; and
      an encapsulation that isolates the OLED device from an ambient environment,
   wherein at least some of the plurality of OLED devices are redundant OLED devices, and
   wherein the controller is configured to turn on one or more of the redundant OLED devices to compensate for the sensed degradation.

2. The lighting system of claim 1, wherein the controller is configured to selectively drive at least some of the plurality of OLED devices at different activation levels by controlling at least one of a drive voltage level, a drive current level, a pulse width, a pulse frequency, an on state, or an off state.

3. The lighting system of claim 1, wherein the controller is configured to selectively drive at least some of the plurality of OLED devices at different activation levels to improve a lifetime of the lighting system.

4. The lighting system of claim 1, wherein the controller is configured to selectively drive at least some of the plurality of OLED devices at different activation levels to improve a lifetime of the lighting system based on different wearing levels of the plurality of OLED devices.

5. The lighting system of claim 1, wherein the controller is configured to selectively drive at least some of the plurality of OLED devices at different activation levels to improve a lifetime of the lighting system based on different wearing levels of the plurality of OLED devices, and wherein a wearing level of an OLED device is determined based on one or more of an accumulative duration that the OLED device has been previously activated, a measured current, a capacitance, a junction temperature, or a luminance of the OLED device.

6. The lighting system of claim 1, wherein the controller is configured to selectively drive at least some of the plurality of OLED devices at different activation levels such that an output light has a desired color characteristic.

7. The lighting system of claim 6, wherein the controller is configured to selectively drive at least some of the plurality of OLED devices at different activation levels to compensate for degradation of some of the plurality of OLED devices thereby maintaining the desired color characteristic of the output light.

8. The lighting system of claim 6, wherein the desired color characteristic is one of a color temperature or a color rendering index.

9. The lighting system of claim 1, wherein the controller is configured to selectively drive at least some of the plurality of OLED devices at different activation levels such that an output light has a desired intensity and a desired color characteristic.

10. The lighting system of claim 1, wherein the controller is configured to selectively drive at least some of the plurality of OLED devices at different activation levels such that an output light has a desired intensity.

11. The lighting system of claim 1, further comprising a sensor configured to sense a degradation of at least one of the plurality of OLED devices, wherein the controller is configured to selectively drive at least some of the plurality of OLED devices at different activation levels to compensate for the sensed degradation.

12. The lighting system of claim 1, further comprising a sensor configured to sense a degradation of at least one of the plurality of OLED devices, wherein the sensor is configured to sense the degradation by measuring one of a temperature, a current, a capacitance, or a luminance of at least one of the plurality of OLED devices.

13. The lighting system of claim 1, wherein the controller is further configured to selectively drive at least some of the plurality of OLED devices at different activation levels to improve a lifetime of the lighting system and to have an output light with a desired color characteristic.

14. The lighting system of claim 1, wherein at least some of the plurality of OLED devices are vertically stacked.

15. The lighting system of claim 1, wherein at least some of the plurality of OLED devices are configured as edge-emitting OLED devices.

16. The lighting system of claim 1, wherein at least some of the plurality of OLED devices are vertically stacked, and wherein at least some of the plurality of OLED devices are substantially transparent.

17. The lighting system of claim 1, wherein the plurality of OLED devices include a first number of a first type of OLED devices and a second number of a second type of OLED devices, and wherein the first type of OLED devices have a light emission spectrum different from a light emission spectrum of the second type of OLED devices.

18. The lighting system of claim 1, wherein the plurality of OLED devices include a first number of a first type of OLED devices and a second number of a second type of OLED devices, and wherein the first type of OLED devices have a light emission spectrum different from a light emission spectrum of the second type of OLED devices, wherein the first type of OLED devices have an expected lifetime shorter than the second type of OLED devices, and wherein the first number is correspondingly larger than the second number.

19. The lighting system of claim 1, wherein the plurality of OLED devices include a first number of a first type of OLED devices and a second number of a second type of OLED devices, wherein the first type of OLED devices have a spectrum different from a spectrum of the second type of OLED devices, wherein the first type of OLED devices have a lifetime shorter than the second type of OLED devices, wherein the first number is correspondingly larger than the second number, and wherein the controller configured to selectively drive the first type of OLED devices at different activation levels such that not all of the first type of OLED devices are turned on at the same time thereby increasing the lifetime of the lighting system.

20. The lighting system of claim 1, further comprising a mount, wherein at least some of the plurality of OLED devices are configured to be removably coupled to the mount.

21. A lighting system comprising:
a plurality of organic light emitting diode (OLED) devices,
wherein each of the plurality of OLED devices has an active region,
wherein at least some of the OLED devices have active regions of different sizes,
wherein the different sizes are selected such that light emitted from the lighting system has desired color characteristics and that the OLED devices having active regions of different sizes have substantially matching lifetimes,
wherein the plurality of OLED devices include a first type of OLED devices each having an active region of a first size and a first expected lifetime, and a second type of OLED devices each having an active region of a second size and a second expected lifetime,
wherein a ratio of the first size to the second size is approximately proportional to a ratio of the second expected lifetime to the first expected lifetime,
wherein the first type of OLED devices are driven at a first current density, and the second type of OLED devices are driven at a second current density, and
wherein a ratio of the first current density to the second current density is approximately proportional to a ratio of the second size to the first size thereby substantially matching actual lifetimes of the first type of OLED devices and the second type of OLED devices.

22. The lighting system of claim 21, wherein the plurality of OLED devices include a first plurality of active regions configured to emit substantially red light, a second plurality of active regions configured to emit substantially green light, and a third plurality of active regions configured to emit substantially blue light, and wherein at least some of the third plurality of active regions have increased sizes and correspondingly reduced current densities as compared with the first plurality and the second plurality of active regions.

23. The lighting system of claim 21, wherein at least one of the plurality of OLED device comprises:
at least one coupler configured to electrically couple the OLED device to a power supply; and
an encapsulation that isolates the OLED device from an ambient environment.

24. A method comprising:
selectively controlling activation levels of at least some of a plurality of organic light emitting diode (OLED) devices in a lighting system to improve a lifetime of the lighting system
assigning addresses to the at least some of the plurality of OLED devices; and
swapping addresses between at least a first OLED device and a second OLED device among the at least some of the plurality of OLED devices,
wherein the first and second OLED devices have different wearing levels, and
wherein a wearing level of an OLED device is determined based on one or more of an accumulative duration that the OLED device has been previously activated, a measured current, a capacitance, a junction temperature, or a luminance of the OLED device.

25. The method of claim 24, further comprising determining wearing levels of the at least some of the plurality of OLED devices, wherein the selectively controlling activation levels of at least some of the plurality of OLED devices comprises selectively controlling the at least some of the plurality of OLED devices based on the determined wearing levels of the OLED devices.

26. The method of claim 24, wherein the plurality of OLED devices include a first number of blue OLED devices, a second number of red OLED devices, and a third number of green OLED devices, wherein the first number is about twice the second number, wherein the selectively controlling activation levels of at least some of the plurality of OLED devices comprises alternately activating blue OLED devices thereby increasing a lifetime of the lighting system.

27. A method, comprising:
selecting, from a plurality of pre-manufactured modular organic light emitting diode (OLED) devices, a subset of OLED devices; and
coupling the selected subset of OLED devices to a mount,
wherein the subset of OLED devices is selected to have a mixed output light spectrum with desired color characteristics,
wherein the selecting the subset of OLED devices comprises selecting a first number of a first type of OLED devices and a second number of a second type of OLED devices,
wherein the first type of OLED devices have a first spectrum different from a second spectrum of the second type of OLED devices,
wherein the first type of OLED devices have an expected lifetime substantially shorter than an expected lifetime the second type of OLED devices, and
wherein selecting the subset of OLED devices comprises selecting the first number substantially larger than the second number.

28. The method of claim 27, wherein the selecting the subset of OLED devices comprises selecting a first number of a first type of OLED devices and a second number of a second type of OLED devices, and wherein the first type of OLED devices have a first spectrum different from a second spectrum of the second type of OLED devices.

29. The method of claim 27, further comprising selectively activating the first type of OLED devices such that not all of the first type of OLED devices are activated at the same time or at the same activation level, thereby increasing the lifetime of the first type of OLED devices.

30. The method of claim 27, further comprising selectively activating the first type of OLED devices, wherein selectively activating the first type of OLED devices comprises electrically driving the first type of OLED devices with voltage or current pulses shorter than those of the second type of OLED devices.

31. The method of claim 27, further comprising selectively driving at least some of the subset of OLED devices with healing current pulses, wherein selectively driving at least some of the subset of OLED devices with healing current pulses comprises reversely biasing the devices during part of the current pulses to heal the devices.

32. The method of claim 27, further comprising selectively driving at least some of the plurality of OLED devices to different activation levels to compensate for degradation of some of the plurality of OLED devices thereby maintaining the desired output color characteristics.

33. The method of claim 27, further comprising:
sensing a degradation of one or more of the plurality of OLED devices; and
driving the one or more of the plurality of OLED devices at different activation levels to compensate for the sensed degradation.

34. The method of claim 27, further comprising:
sensing a degradation of one or more of the plurality of OLED devices, wherein at least some of the plurality of OLED devices are redundant OLED devices; and
turning on one or more of the redundant OLED devices to compensate for the sensed degradation.

35. The method of claim 27, further comprising sensing a degradation of one or more of the plurality of OLED devices by measuring one of a temperature, a current, a capacitance, or a luminance of the one or more of the plurality of OLED devices.

36. A lighting system comprising:
a plurality of organic light emitting diode (OLED) devices; and
a controller configured to selectively drive at least some of the plurality of OLED devices at different activation levels,
wherein at least one of the plurality of OLED devices comprises:
at least one coupler configured to electrically couple the OLED device to a power supply; and
an encapsulation that isolates the OLED device from an ambient environment,
wherein the plurality of OLED devices include a first number of a first type of OLED devices and a second number of a second type of OLED devices,
wherein the first type of OLED devices have a light emission spectrum different from a light emission spectrum of the second type of OLED devices,
wherein the first type of OLED devices have an expected lifetime shorter than the second type of OLED devices, and
wherein the first number is correspondingly larger than the second number.

37. A method comprising:
selectively controlling activation levels of at least some of a plurality of organic light emitting diode (OLED) devices in a lighting system to improve a lifetime of the lighting system,
wherein the plurality of OLED devices include a first number of blue OLED devices, a second number of red OLED devices, and a third number of green OLED devices,
wherein the first number is about twice the second number, and
wherein the selectively controlling activation levels of at least some of the plurality of OLED devices comprises alternately activating blue OLED devices thereby increasing a lifetime of the lighting system.

38. A method, comprising:
selecting, from a plurality of pre-manufactured modular organic light emitting diode (OLED) devices, a subset of OLED devices, wherein the subset of OLED devices is selected to have a mixed output light spectrum with desired color characteristics;
coupling the selected subset of OLED devices to a mount; and
selectively driving at least some of the subset of OLED devices with healing current pulses, wherein selectively driving at least some of the subset of OLED devices with healing current pulses comprises reversely biasing the devices during part of the current pulses to heal the devices.

39. A method, comprising:
selecting, from a plurality of pre-manufactured modular organic light emitting diode (OLED) devices, a subset of OLED devices, wherein the subset of OLED devices is selected to have a mixed output light spectrum with desired color characteristics;
coupling the selected subset of OLED devices to a mount;
sensing a degradation of one or more of the plurality of OLED devices, wherein at least some of the plurality of OLED devices are redundant OLED devices; and
turning on one or more of the redundant OLED devices to compensate for the sensed degradation.

* * * * *